(12) United States Patent
Jackman et al.

(10) Patent No.: US 7,282,240 B1
(45) Date of Patent: Oct. 16, 2007

(54) ELASTOMERIC MASK AND USE IN FABRICATION OF DEVICES

(75) Inventors: Rebecca J. Jackman, Boston, MA (US); David C. Duffy, Cambridge, MA (US); George M. Whitesides, Newton, MA (US); Kathleen Vaeth, Rochester, NY (US); Klavs F. Jensen, Lexington, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 09/694,074

(22) Filed: Oct. 20, 2000

Related U.S. Application Data

(63) Continuation of application No. PCT/US99/08623, filed on Apr. 20, 1999.

(51) Int. Cl.
*B05D 1/32* (2006.01)

(52) U.S. Cl. ...................................... 427/282

(58) Field of Classification Search ........ 427/154–156, 427/282, 443.1, 157, 96, 97, 64–68, 164, 427/169; 435/7.1–7.95
See application file for complete search history.

(56) References Cited

U.S. PATENT DOCUMENTS

| | | | |
|---|---|---|---|
| 4,093,754 A * | 6/1978 | Parsons | |
| 4,097,776 A * | 6/1978 | Allinikov | 313/502 |
| 4,119,745 A * | 10/1978 | Smith | 427/66 |
| 4,493,757 A | 1/1985 | Piepers | |
| 4,511,599 A * | 4/1985 | Rustomji | 427/66 |
| 4,518,636 A | 5/1985 | Richards | |
| 4,527,988 A | 7/1985 | Lutz et al. | |
| 4,728,591 A | 3/1988 | Clark et al. | |
| 4,777,117 A | 10/1988 | Murata et al. | |
| 4,871,671 A | 10/1989 | Errede et al. | |
| 4,988,424 A * | 1/1991 | Woodward et al. | 204/192.29 |
| 5,077,085 A | 12/1991 | Schnur et al. | |

(Continued)

FOREIGN PATENT DOCUMENTS

| | | |
|---|---|---|
| DE | 33 31 377 | 3/1985 |

(Continued)

OTHER PUBLICATIONS

MSDS for cadmium Oxide , updated Nov. 18, 2003.*

(Continued)

*Primary Examiner*—Fred J. Parker
(74) *Attorney, Agent, or Firm*—Wolf, Greenfield & Sacks, P.C.

(57) ABSTRACT

An elastomeric mask is provided that allows deposition of a variety of materials through mask openings. The mask seals effectively against substrate surfaces, allowing simple deposition from fluid phase, gas phase, and the like or removal of material using gaseous or liquid etchants. The mask then can be simply peeled from the surface of the substrate leaving the patterned material behind. Multi-layered mask techniques are described in which openings in an upper mask allow selected openings of a lower mask to remain unshielded, while other openings of the lower mask are shielded. A first deposition step, following by re-orientation of the upper mask to expose a different set of lower mask openings, allows selective deposition of different materials in different openings of the lower mask. Pixelated organic electroluminescent devices are provided via the described technique.

21 Claims, 11 Drawing Sheets

U.S. PATENT DOCUMENTS

| | | | |
|---|---|---|---|
| 5,147,763 | A | 9/1992 | Kamitakahara |
| 5,155,749 | A | 10/1992 | DiMilia et al. |
| 5,160,959 | A | 11/1992 | Everett et al. |
| 5,259,926 | A | 11/1993 | Kuwabara et al. |
| 5,480,530 | A | 1/1996 | Zejda |
| 5,486,452 | A * | 1/1996 | Gordon et al. |
| 5,510,628 | A | 4/1996 | Georger, Jr. et al. |
| 5,593,814 | A | 1/1997 | Matsuda et al. |
| 5,665,496 | A | 9/1997 | Omika et al. |
| 5,681,661 | A | 10/1997 | Kelly |
| 5,691,018 | A | 11/1997 | Kelley et al. |
| 5,705,043 | A | 1/1998 | Zwerner et al. |
| 5,721,131 | A | 2/1998 | Rudolph et al. |
| 5,914,182 | A | 6/1999 | Drumheller |
| 5,948,470 | A * | 9/1999 | Harrison et al. |
| 5,976,826 | A | 11/1999 | Singhvi et al. |
| 6,181,144 | B1 * | 1/2001 | Hembree et al. |
| 6,207,369 | B1 * | 3/2001 | Wohlstadter et al. |
| 6,355,198 | B1 | 3/2002 | Kim et al. |
| 6,368,838 | B1 | 4/2002 | Singhvi et al. |
| 6,645,432 | B1 | 11/2003 | Anderson et al. |
| 6,660,192 | B1 | 12/2003 | Kim et al. |
| 6,686,184 | B1 | 2/2004 | Anderson et al. |
| 6,743,633 | B1 * | 6/2004 | Hunter .................. 436/46 |
| 6,752,942 | B2 | 6/2004 | Kim et al. |
| 6,770,721 | B1 | 8/2004 | Kim |
| 2002/0029814 | A1 | 3/2002 | Unger et al. |
| 2002/0134907 | A1 | 9/2002 | Benett et al. |
| 2003/0156992 | A1 | 8/2003 | Anderson et al. |
| 2004/0027675 | A1 | 2/2004 | Wu et al. |
| 2004/0156988 | A1 | 8/2004 | Mehenti et al. |

FOREIGN PATENT DOCUMENTS

| | | |
|---|---|---|
| DE | 38 41 317 | 6/1990 |
| DE | 195 45 151 A1 | 6/1997 |
| FR | 2 676 970 A1 | 12/1992 |
| GB | 2 201 637 | 9/1988 |
| JP | 02232238 | 9/1990 |
| WO | WO96/15223 A1 | 5/1996 |
| WO | WO97/33737 A1 | 9/1997 |
| WO | WO99/54786 | 10/1999 |
| WO | WO 00/60356 A1 | 10/2000 |
| WO | WO 01/70389 A2 | 9/2001 |
| WO | WO 01/89787 A2 | 11/2001 |
| WO | WO 01/89788 A2 | 11/2001 |
| WO | WO 02/084340 A1 | 10/2002 |

OTHER PUBLICATIONS

Micromolding of Polymers in Capillaries: Applications in Microfabrication; Xia et al, Chem. Mater., 8, 1558-1567 (1996).*

Patent Abstracts of Japan, vol. 014, No. 544.

X.D. Xiang et al., "A Combinatorial Approach to Materials Discovery", *Science*, vol. 268, Jun. 23, 1995, pp. 1738-1740.

Author Unknown, "Lift Off Technique for High Temperature Metal Depositions", *IBM Technical Disclosure Bulletin*. Dec. 1972, vol. 15, No. 7, p. 2305.

P. Yam, "Plastics Get Wired", *Scientific American*, Jul. 1995, pp. 83-87.

E. M. Kirschner, "Electronic Chemicals", *C&EN*, Nov. 24, 1997, pp. 25-39.

G. J. Burger et al., "High-resolution shadow-mask patterning in deep holes and its application to an electrical wafer feed-through", *Sensors and Actuators*, A 54, 1996, pp. 669-673.

S. Noach et al., "Microfabrication of an electroluminescent polymer light emitting diode pixel array", *Appl. Phys. Lett.*, 69 (24), Dec. 9, 1996, pp. 3650-3652.

M. Renak et al., "Microlithographic Process for Patterning Conjugated Emissive Polymers", *Advanced Materials*, 1997, 9, No. 5, pp. 392-394.

M. Granstrom et al., "Flexible Arrays of Submicrometer-Sized Polymeric Light Emitting Diodes", *Advanced Materials*, 1995, 7, No. 12, pp. 1012-1015.

M. Granstrom et al., "Micrometer-and Nanometer-Sized Polymeric Light-Emitting Diodes", *Science*, vol. 267, Mar. 10, 1995, pp. 1479-1481.

Z. Bao et al., "High-Performance Plastic Transistors Fabricated by Printing Techniques", *Chem Mater* 1997, 9, pp. 1299-1301.

W. W. Clegg et al., "The preparation of piezoceramic-polymer thick films and their application as micromechanical actuators", *Sensors and Actuators*, A 58 (1997) pp. 173-177.

H. Goldberg et al., "Screen printing: a technology for the batch fabrication of integrated chemical-sensor arrays", *Sensors And Actuators*, B 21 (1994) pp. 171-183.

F. Garnier et al., "All-Polymer Field-Effect Transistor Realized by Printing Techniques", *Science*, vol. 265, Sep. 16, 1994, pp. 1684-1686.

Y. Mikami et al., "A New Patterning Process Concept for Large-Area Transistor Circuit Fabrication Without Using an Optical Mask Aligner", *IEEE*, vol. 41, No. 1, Mar. 1994.

H. Lorenz et al., "Low-cost technology for multilayer electroplated parts using laminated dry film resist", *Sensors and Actuators*, A 53 (1996) pp. 364-368.

S. Leppavuori et al., "A novel thick-film technique, gravure offset printing, for the realization of fine-line sensor structures" *Sensors and Actuators*, A 41-42 (1994) pp. 593-596.

V. Golovanov et al., "Different thick-film methods in printing of one-electrode semiconductor gas sensors", *Sensors and Actuators*, B 34 (1996) pp. 401-406.

Y. Kijima et al., "RGB Luminescence from Passive-Matrix Organic LED's", *IEEE*, vol. 44, No. 8, Aug. 1997, pp. 1222-1228.

Z. Shen et al, "Three-Color, Tunable, Organic Light-Emitting Devices" *SCIENCE*, vol. 276, Jun. 27, 1997, pp. 2009-2011.

P. E. Burrows et al., "Achieving Full-Color Organic Light-Emitting Devices for Lightweight, Flat-Panel Displays", *IEEE*, vol. 44, No. 8, Aug. 1997, pp. 1188-1203.

G. Gustfsson et al., "Flexible light-emitting diodes made from soluble conducting polymers", *Nature*, vol. 357, Jun. 11, 1992, pp. 477-479.

J. Wang et al., "Identification of a Blue Photoluminescent Composite Material from a Combinatorial Library", *SCIENCE*, vol. 279, Mar. 13, 1998, pp. 1712-1714.

T. R. Hebner et al., "Ink-jet printing of doped polymers for organic light emitting devices", *Applied Physics Letters*, vol. 72, No. 5, Feb. 2, 1998, pp. 519-521.

A. You et al., "A miniaturized array assay format for detecting small molecule-protein interactions in cells", *Chemistry & Biology*, 1997, vol. 4, No. 12, pp. 969-975.

D. Duffy et al., "Patterning Electroluminescent Materials with Feature Sizes as Small as 5 μm Using Elastomeric Membranes as Masks for Dry Lift-Off", *Advanced Materials*, 1999, 11, No. 7, pp. 546-552.

R. Jackman et al., "Using Elastomeric Membranes as Dry Resists and for Dry Lift-Off", *Langmuir* 1999, vol. 15, No. 8, pp. 2973-2984.

E. Ostuni et al., "Patterning Mammalian Cells Using Elastomeric Membranes", *Langmuir* 2000, No. 16, pp. 7811-7819.

K. Vaeth et al., "Transition Metals for Selective Chemical Vapor Deposition of Parylene-Based Poymers", *Chem. Mater* 2000, No. 12, pp. 1305-1313.

Astor et al., "Human Leukocyte Migration Inhibition in Agarose Using Four Antigens: Correlation with Skin Reactivity," *J. Immunology*, vol. 110, No. 4, Apr. 1973, pp. 1174-1179.

Chen et al., "Geometric Control of Cell Life and Death," *Science*, vol. 276, May 30, 1997, pp. 1425-1428.

Chiu et al., "Patterned Deposition of Cells and Proteins onto Surfaces by Using Three-Dimensional Microfluidic Systems," *PNAS*, vol. 97, No. 6, Mar. 14, 2000, pp. 2408-2413.

Clausen, "Tuberculin-Induced Migration Inhibition of Huamn Peripheral Leucocytes in Agarose Medium," *Acta Allergologica*, 1971, pp. 56-80.

Cutler, "A Simple In Vitro Method for Studies on Chemotaxis," *Proceedings of the Society for Experimental Biology and Medicine*, vol. 147, 1974, pp. 471-474.

Dewez et al., "Adhesion of Mammalian Cells to Polymer Surfaces: from Physical Chemistry of Surfaces to Selective Adhesion on Defined Patterns," *Biomaterials*, vol. 19, 1998, pp. 1441-1445.

Folch et al., "Microfabricated Elastomeric Stencils for Micropatterning Cell Cultures," *J. Biomed. Mater. Res.*, vol. 52, Mar. 9, 2000, pp. 346-353.

Goldstein et al., "Studies of the Precipitating Antibody Response in Pulmonary Aspergillosis," *Int. Arch. Allergy*, vol. 44, 1973, pp. 1-10.

Hirschi et al., "PDGF, TGF-β, and Heterotypic Cell-Cell Interactions Mediate Endothelial Cell-Induced Recruitment of 10T1/2 Cells and Their Differentiation to a Smooth Muscle Fate," *J. Cell Biology*, vol. 141, No. 3, May 4, 1998, pp. 805-814.

Mrksich et al., "Using Microcontact Printing to Pattern the Attachment of Mammalian Cells to Self-Assembled Monolayers of Alkanethiolates on Transparent Films of Gold and Silver," *Experimental Cell Research*, vol. 235, May 30, 1997, pp. 305-313.

Nelson et al., "Chemotaxis under Agarose: A New and Simple Method for Measuring Chemotaxis and Spontaneous Migration of Human Polymorphonuclear Leukocytes and Monocytes," *J. of Immunology*, vol. 115, No. 6, Dec. 1975, pp. 1650-1656.

Pratt et al., "Mechanisms of Cytoskeletal Regulation," *AJP*, Dec. 1984, pp. 349-354.

Zacchi et al., "In Vitro Engineering of Human Skin-Like Tissue," *J. Biomed. Mater. Res.*, vol. 40, 1998, pp. 187-194.

Communication Pursuant to Article 96(2) EPC dated Sep. 22, 2005 in PCT Application No. 99 918 698.4-1226.

\* cited by examiner

500 μm

50 μm

ELASTOMERIC MASK AND USE IN FABRICATION OF DEVICES

RELATED APPLICATIONS

This application is a continuation of International Pat. Apl. Ser. No. PCT/US99/08623, filed Apr. 20, 1999, which claims priority to U.S. patent application Ser. No. 09/063, 742, filed Apr. 21, 1998, abandoned.

FIELD OF THE INVENTION

The present invention relates generally to surface modification, and more particularly to the deposition of material onto a surface through openings in an elastomeric mask.

BACKGROUND OF THE INVENTION

In fields involving microelectronic devices, sensors, and optical elements, the development of devices that are small relative to the state of the art, controllable, and conveniently and relatively inexpensively reproduced with a relatively low failure rate is important.

There is currently great interest in the fabrication of optical devices based on organic materials that display electroluminescence (Burrows, et al., *Current Opinion in Solid State and Materials Science*, 1997, 2, 236; Baigent, et al., *Synth. Meth.*, 1994, 67, 3). These devices could find application in a variety of settings, including flat panel optical displays. Electroluminescence, including in some cases organic electroluminescent materials, is described by Yam, "Plastics Get Wired", *Scientific American*, July, 1995, 83-87; Kijima, et al., "RGB Luminescence from Passive-Matrix Organic LED's", *IEEE Transactions on Electron Devices*, 44, 8, August, 1997; Shen, et al., "Three-Color, Tunable Organic Light-Emitting Devices", *Science*, 276, Jun. 27, 1997; and Burrows, et al., "Achieving Full-Color Organic Light-Emitting Devices for Lightweight, Flat-Panel Displays", *IEEE Transactions on Electron Devices*, 44, 8, August, 1997. A variety of materials, including electroluminescent materials, have been deposited on surfaces at small feature size using a variety of techniques including laser ablation, photolithography, the use of shadow masks, and other techniques.

Burger, et al., in "High-Resolution Shadow Mask Patterning in Deep Holes and its Application to an Electrical Wafer Feed-Through", *Sensors and Actuators*, A 54 (1996) 669-673, describe electron-beam evaporation of metals through a shadow mask.

Wang, et al. in "identification of a blue photoluminescent composite material from a combinatorial library" *Science*, 279, Mar. 13, 1998, 1712-1714, describe a quaternary combinatorial masking strategy used in conjunction with photolithography to generate compositionally diverse thin-film phosphor libraries.

Noach, et al., in "Microfabrication of an Electroluminescent Polymer Light Emitting Diode Pixel Array", *Appl. Phys. Lett.*, 69 (24), Dec. 9, 1996, describe a technique for the fabrication of a light emitting diode array based on conjugated electroluminescent polymers sandwiched between appropriate electrodes. The method is based upon direct photoablation with an excimer laser.

Renak, et al., in "Microlithographic Process for Patterning Conjugated Emissive Polymers", *Adv. Mater.*, 1997, 9, 5, 392-394, describe a microlithographic process for patterning electroluminescent poly(p-phenylenevinylene) (PPV), and show preliminary results from pixel-like LED arrays prepared by this technique. Photoacid generators, molecules that generate acids upon photolysis, were used. A photoacid generator admixed with a PPV precursor is spin-cast onto a substrate, according to the technique, followed by irradiation through a mask to promote formation of triflic acid, in turn generating PPV. Development in chloroform washes away un-reacted precursor, leaving patterned PPV.

Granstrom, et al., in "Micrometer- and Nanometer-Sized Polymeric Light-Emitting Diodes", *Science*, 267, Mar. 10, 1995, describe a technique for the fabrication of light-emitting diodes by polymerizing doped and conducting polymers electrochemically in randomly-distributed pores of commercially-available microfiltration membranes. Polycarbonate membranes were used. Electroluminescent polymer was spin-coated from xylene solution on top of a microfiltration membrane-contact structure.

While the above-described and other techniques may be advantageous in many circumstances, many require relatively sophisticated and expensive apparatus and/or require excessive numbers of steps or potentially destructive chemical techniques. For example, laser ablation is relatively slow and requires relatively complex apparatus. Also, it is limited in that pixels are defined by patterning cathode material rather than the electroluminescent material itself, and therefore the technique is not well-suited to creation of a multicolored display. Photolithography is generally faster than laser ablation and therefore has greater potential for high-volume production of useful devices. However, wet chemical etching generally is required to define pixels using photolithography, which has a deleterious effect on electroluminescent efficiency. Lidzey, et al. (*Synth. Meth.*, 1996, 82, 141) report that the efficiency of an electroluminescent device was decreased by 60 percent upon one photolithographic step involving a wet chemical etch. Devices also can be degraded by exposure to atmospheric water and oxygen, inevitable during photolithography. Encapsulation has been used as a technique to avoid degradation during photolithography (Tian, et al., *Appl. Phys. Lett.*, 1997, 71, 3197). Encapsulation, however, is problematic, according to Tian, et al., who report that it can lead to shorting of devices. Encapsulation also adds an extra step to the fabrication process. Shadow masking techniques that are known typically involve the use of machined-metal masks, in which the size of pixels are generally considered too large for high-resolution displays. In many of the above techniques, it is not possible to fabricate displays on non-planar surfaces.

Hebner, et al. in "Ink-Jet Printing of Doped Polymers for Organic Light Emitting Devices", *Appl. Phys. Let.* 72, 5, Feb. 2, 1998, describe patterning luminescent-doped polymer films using ink-jet printing.

International patent publication WO 97/33737 (International patent application serial number PCT/US97/04005) of Kim, et al., entitled "Method of Forming Articles and Patterning Surfaces Via Capillary Micromolding", describes techniques for applying a variety of species to surfaces according to predetermined patterns. An elastomeric article having a contoured surface including a plurality of protrusions and intervening indentations is positioned against a substrate surface so that the outward-facing surfaces of the protrusions contact the substrate surface. In this way a plurality of channels are created, each defined by the surface of an indentation and a portion of the substrate surface in register with the indentation. A fluid carrier or precursor is introduced into the channels, an agent is deposited at regions of the substrate surface corresponding to the channels, and the article is removed from the surface. Patterned chemical reactions, precipitation, polymerization, and the like can take place at the substrate surface in this manner. Alternatively, an agent can be positioned in the indentations and the contoured surface brought into contact with a surface to be modified. Also described in Kim, et. al. is a flexible polymeric mask used to pattern deposition of material on a surface.

Rogers, et al., (*Appl. Phys. Lett.* 7, 70, 1997) describe a technique for forming a photomask on the exterior surface of an optical fiber. An elastomeric article, having a contoured surface including protrusions and intervening indentations, is used to apply a chemical species to the exterior surface of an optical fiber according to the pattern of the protrusions. Specifically, the axis of the optical fiber is positioned perpendicularly to the protrusions and is rolled across the protrusions, and rings of the chemical species are transferred from the protrusions to the outer surface of the fiber in this way. The chemical species can facilitate creation of a photomask by serving as a metal deposition catalyst.

Several physical masking techniques are known for application of specific materials to specific portions of a surface.

Flexible masks are known for use in selective exposure of photoresist in a pattern corresponding to the pattern of the mask. U.S. Pat. No. 4,735,890 (Nakane) describes a photomask for photolithographic fine patterning of a photoresist film. A thin film of a polymeric material having elasticity is brought into intimate contact with a photoresist film. Selective exposure of the photoresist through the photomask allows desired patterning of photoresist. Other "contact photolithography" techniques, involving contact between a mask and a photoresist coated substrate, are described in U.S. Pat. No. 5,147,763 (Kamitakahara) and U.S. Pat. No. 5,160,959 (Everett) and U.S. Pat. No. 4,810,621 (Akkapeddi).

U.S. Pat. No. 5,259,926 (Kuwabara) describes a technique for thin-film patterning. A thin film is provided on a substrate and a mask, having a desired pattern, is formed on the thin film by forming a layer of an organic resin on the thin film and forming the organic resin layer in a desired pattern by a mechanical forming member. An exposed portion of the thin film then is removed by etching.

U.S. Pat. No. 4,518,636 (Richards) describes a technique for selective metal plating of a component. Upper and lower faces of the component are contacted with upper and lower masks, respectively, so that the lower mask exposes a part of the component to be plated. The part is positioned over a plating tank and selective plating takes place. The upper mask can be a deformable elastic polymeric material, and the lower mask is a more rigid rubber or plastic material.

U.S. Pat. No. 5,480,530 (Zejda) describes an elastomeric mask for covering the outer marginal area of a disk-shaped substrate surface during a coating process. The substrate can be a compact disk, and the mask is of an annular shape with a circular opening into which the disk is placed. An inner, substrate holder, inserted into a central hole of the disk, also made of elastomeric material.

U.S. Pat. No. 5,691,018 (Kelly) describes a flexible elastomeric mask for protecting apparatus used to mount a work piece to be subjected to thermal spray coating.

U.S. Pat. No. 5,705,043 (Zwerner) describes apparatus for selectively electrolytically plating defined regions of a continuously moving conductive work piece. Elastomeric sealing plates are provided including openings that define areas of work pieces to be plated.

Described above are several techniques for creation of a variety of materials, including electroluminescent materials, that in many cases are complicated and expensive. Also described above are several masking techniques, many of which do not recognize application to very small-feature, very high-resolution techniques. Accordingly, one object of the present invention is to provide high-resolution optical devices that can be multi-color and can display electroluminescence. Another object of the invention is to provide apparatus and techniques for forming such displays. It is another object of the invention to provide improved apparatus and techniques for forming a variety of patterns of a variety of materials on a variety of surfaces at high resolution.

SUMMARY OF THE INVENTION

The present invention provides a series of methods for patterning a surface, and articles including patterns at surfaces.

In one aspect the invention provides a series of methods. One method involves shielding a first portion of a surface of an article with a masking systems including a cohesive mask in conformal contact with a surface of the article. An agent then is allowed to be applied through a channel in the masking system to a second portion of the surface of the article while the agent is prevented from being applied to the first portion. The channel has a dimension of less than one millimeter.

In another embodiment a method is provided that involves shielding a first portion of a surface of an article with a mask while leaving a second portion of the surface of the article remaining unshielded by the mask. The first portion has a dimension of less than one millimeter, and is shielded by positioning the mask in conformal contact with the surface without degrading a portion of the mask proximate the second portion of the surface. An agent then is applied to the second portion of the surface of the article.

In another method a first portion of a non-planar surface of the article is shielded with a mask by bringing a surface of the mask into conformal contact with the non-planar surface of the article an agent then is allowed to pass through a channel within the mask and to be applied to a second portion of the surface of the article while the agent is prevented from being applied to the first portion with the mask. The channel has a dimension of less than one millimeter. Another method involves shielding a first portion of a surface of an article with a masking system by bringing a surface of the masking system into conformal contact with a surface of the article. An agent is allowed to be applied to a second, unshielded portion of the surface of the article while the agent is prevented from application from the first portion of the surface of the article with the masking system. The masking system then is re-placed, and an agent is applied to at least a portion of the first portion of the surface of the article.

In another method, a first portion of a surface of an article is shielded with a mask. A fluid is allowed to be applied to a second portion of the surface while the fluid is prevented from being applied to the first portion with the mask. The second portion of the surface has a dimension of less than one millimeter. A material is allowed to harden from the fluid, and the mask is removed from the surface while leaving the article adhere to the second portion of the surface.

Another method involves shielding a first portion of a surface of a article with a mask by bringing a surface of the mask into conformal contact with the surface of the article while leaving a second portion of the surface of the article unshielded by the mask. The first portion that is shielded has a dimension of less than one millimeter. An agent then is applied to the second portion of the surface and, without exposure of the mask to conditions of degradation, the mask is removed from the surface thereby leaving the agent at the second portion of the surface and the first portion free of the agent.

The invention also provides a method according to any of those described above involving application of an agent to a specific portion of a surface of an article using a mask, followed by application of the same or another agent, via a second masking step involving the same or a different mask, to a portion of the surface such that the agent applied via the second step contacts at least a portion of the agent applied via the first masking step. The method can result in an interconnected pattern of agent on a surface, where the surface also includes regions free of the agent, which can define electrical circuitry or the like. This technique can be used with multiple re-placement steps to produce not only contacting, but intersecting agent deposition portions. For example, a pattern can be used to conduct multiple depositions, or applications, resulting in intersecting wires, or the like.

Another method of the invention involves immobilizing on average less than about $1 \times 10^5$ at each of a plurality of separate, isolated regions of a surface of an article while leaving regions of the surface of the article intervening the separate isolated regions essentially free of the molecules.

In another aspect the invention provides an article that can be used for methods described herein or for other purposes. In one embodiment the article is an elastomeric article including a first surface and an opposing second surface, and plurality of channels passing through the article and connecting the first surface with the second surface. At least one of the plurality of channels has a cross-sectional dimension of less than one millimeter.

Another aspect of the invention involves making a mask. Generally, the method involves providing a master and forming the mask on a surface of the master, preferably by allowing a fluid precursor of the mask to at least partially solidify against the master. The fluid precursor can be a fluid polymer or prepolymer, which can be allowed to polymerize, crosslink, or solidify against the master surface. The master can be fabricated by micromachining or lithographic techniques, and the fluid precursor of the mask can be applied to the master surface by any technique such as pouring, spreading, spin-coating, and the like. Most preferably, the master is fabricated by photolithography, and a precursor of an elastomeric material is spin-coated on a surface of the master and allowed to harden, and is removed to define an elastomeric mask. The fabrication technique can involve applying different layers of fluid precursor to form a mask including several layers.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION OF THE INVENTION

Figure 1:
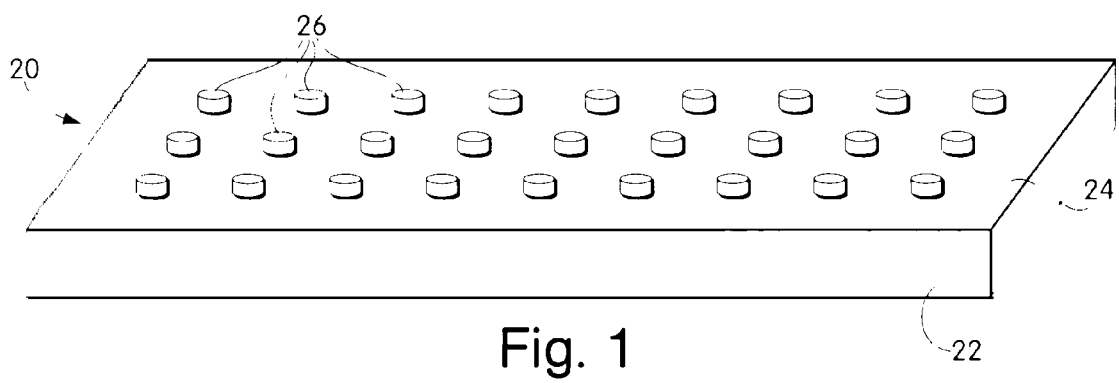
FIG. 1 schematically illustrates a photolithographically-prepared template for creation of an elastomeric masking system of the invention.

The following documents are incorporated herein by reference. Rogers, et al., *Appl. Phys. Lett.* 7, 70, (1997); Kim, et al. *Nature,* 376, Aug. 17, 1997, 581-584; Jackman, et al., Langmuir, 15:8, 2973-2984; U.S. patent application Ser. No. 09/004,583 of Kim, et al., entitled "Method of Forming Articles Including Waveguides Via Capillary Micromolding and Microtransfer Molding", filed Jan. 8, 1998; U.S. Pat. No. 5,512,131 of Kumar, et al. (Apr. 30, 1996); International patent application no. PCT/US96/03073 (publication WO 96/29629, Jun. 26, 1996); International patent application no. PCT/US97/04237 (publication WO 97/34025); and International patent application no. PCT/US97/04005 (publication WO 97/33737, Sep. 18, 1997).

The present invention provides a mask, and techniques for use of the mask that involve shielding selected portions of a surface, while leaving other portions unshielded, and allowing an agent to be applied to unshielded portions via deposition, chemical reaction, or the like. The mask can shield selected portions of the surface by being brought into contact with those portions and, in preferred embodiments, the mask has a flexible surface that allows the mask to conform to the surface. The entire mask can be flexible and therefore can conform to a non-planar surface. In particularly preferred embodiments the mask is a polymeric elastomer that can form a seal against a substrate surface. It is a feature of the invention that masks of the invention can form a seal against a substrate surface in the absence of any clamping apparatus or other apparatus used to apply a force against the mask in a direction of the substrate surface. Where elastomeric surfaces are used, and the elastomeric surface and substrate surface to be masked are clean, sealing can occur essentially instantaneously upon contact without application of significant pressure, and sealing can be maintained without maintenance of any pressure. This sealing is reversible, that is, the mask can be removed from the substrate surface by being peeled off, and can be reused on the same or a different substrate surface. Reusability of a particular mask increases with the thickness of the mask.

The mask can be used for a variety of applications, one of which is the fabrication of an array of pixels of an organic electroluminescent material on a substrate. Multi-colored, pixelated arrays can be made using the preferred mask of the invention via a technique that avoids the use of solvents during fabrication, and does not require encapsulation of pixels between formation steps. The mask can include a very small-scale pattern, for example an array of holes of less than about 1 millimeter down to less than about 1.5 micron. When the mask conforms to and seals against a substrate, material can be patterned through the holes against the substrate, and the mask removed, leaving an array of pixels, without the requirement of steps and apparatus involved in laser ablation, photolithography, and shadow mask procedures.

Figure 2:
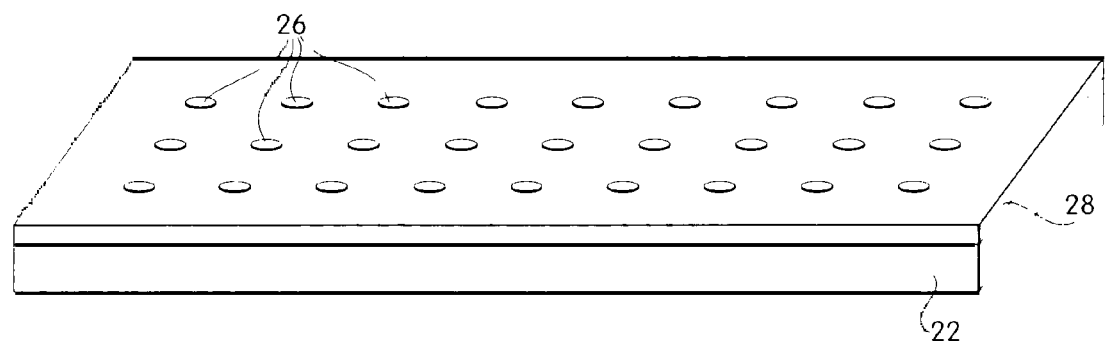
FIG. 2 schematically illustrates a polymeric elastomeric masking system formed on the template of FIG. 1.
Figure 3:
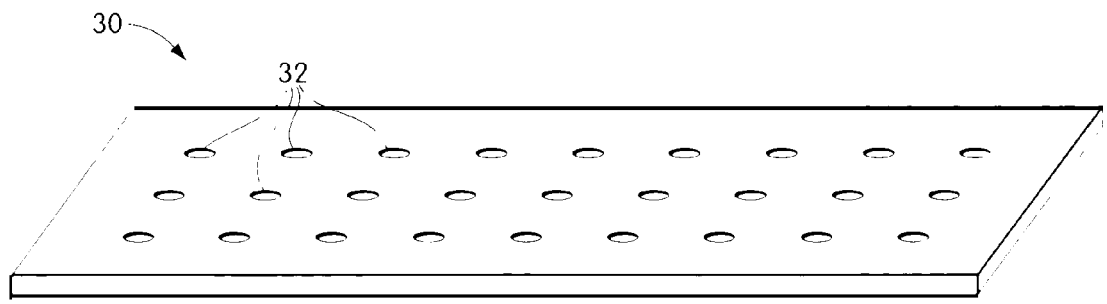
FIG. 3 schematically illustrates a masking system formed as shown in FIGS. 1 and 2, following removal from the template.

Referring now to FIGS. 1-3, one exemplary technique for fabricating a mask in accordance with the invention is illustrated schematically. FIG. 1 shows a master 20 for fabricating an elastomeric mask of the invention. Master 20 includes a substrate 22, on a top surface 24 of which is created an array of essentially cylindrical posts 26 via, for example, photolithography. Referring to FIG. 2, a prepolymeric material 28 then is spin-cast onto the master 20 (on surface 24 and around posts 26) such that the thickness of propolymer layer 28 is less than the height of posts 26. Posts 26 thus protrude slightly above the layer of prepolymer material 28. After curing of the propolymer it is peeled away from the master 20 to yield a membraneous mask 30 as shown in FIG. 3. Mask 30 includes a plurality of holes, or channels 32 that correspond to posts 26 of master 20.

The pattern of channels 32 in mask 30 is for illustrative purposes only. Any pattern, for example a pattern defined by a single channel or many channels that can be circular, oval, square, rectangular, and the like, and arranged in a grid-like array (as illustrated) or in a non-array (for example random pattern) can be used. The pattern can include alphanumeric characters. The mask and channels can be of a variety of dimensions. In preferred embodiment, the mask has a thickness (which defines a channel length) of no more than about 1 millimeter. Preferably, the thickness of the mask is no more than about 500 microns, more preferably no more than about 200 microns, more preferably no more than about 100 microns, more preferably still no more than about 25 microns, and the mask can be no more than about 30 microns thick in some embodiments. The channels have a preferred cross-sectional dimension that corresponds to the thickness of the mask to create a length-to-diameter ratio of channels of no more than about 5 to 1. Preferably, the channels have a length-to-diameter ratio of no more than about 2 to 1.

The mask is particularly suited for creation of high-resolution electroluminescent displays, or other devices requiring high resolution and large numbers of small features, and accordingly in preferred embodiments includes at least about 100 channels 32. At least about 50% of the channels in this embodiment have a cross-sectional dimension of less than about 200 microns. The channels can be of a variety of cross-sectional shapes and, as illustrated, are essentially circular in cross-section. Where the channels are non-circular, for example ovoid or elongated rectangular, the "cross-sectional dimension" is meant to define the shortest distance across the cross-section of the channel. "Maximum cross-sectional dimension" in this context means the longest distance across the cross-section of the channels.

Preferably, at least about 98% of the channels 26 have a cross-sectional dimension of less than about 200 microns, more preferably the mask includes at least about 500 channels each of less than about 200 microns in cross-sectional dimension, and each channel spaced from an adjacent channel by no more than about 400 microns. This close spacing is particularly important in creation of microelectronic devices where each component created in register with a channel 32 should not be in electrical communication with an adjacent component. The mask of the invention facilitates surprisingly high-resolution deposition that allows creation of components in close proximity to each other but without contact with each other (leakage between the mask and masked surface is avoided).

In more preferred embodiments the mask can include at least about 1000 channels, 1500 channels, or even 2000 or more channels, with at least about 50% of the channels, more preferably at least about 98% of the channels, or essentially all of the channels having a cross-sectional dimension of less than about 100 microns, with each channel spaced from an adjacent channel by no more than about 200 microns. More preferred channel dimensions are less than about 50 microns, less than about 25 microns, less than about 10 microns, less than about 5 microns, less than about 3 microns, and less than about 1.5 microns, with spacing between channels of no more than about twice the cross-section of each channel. In all of the above-described embodiments, the cross-section can be maximum cross-sectional channel dimension.

Figure 4:
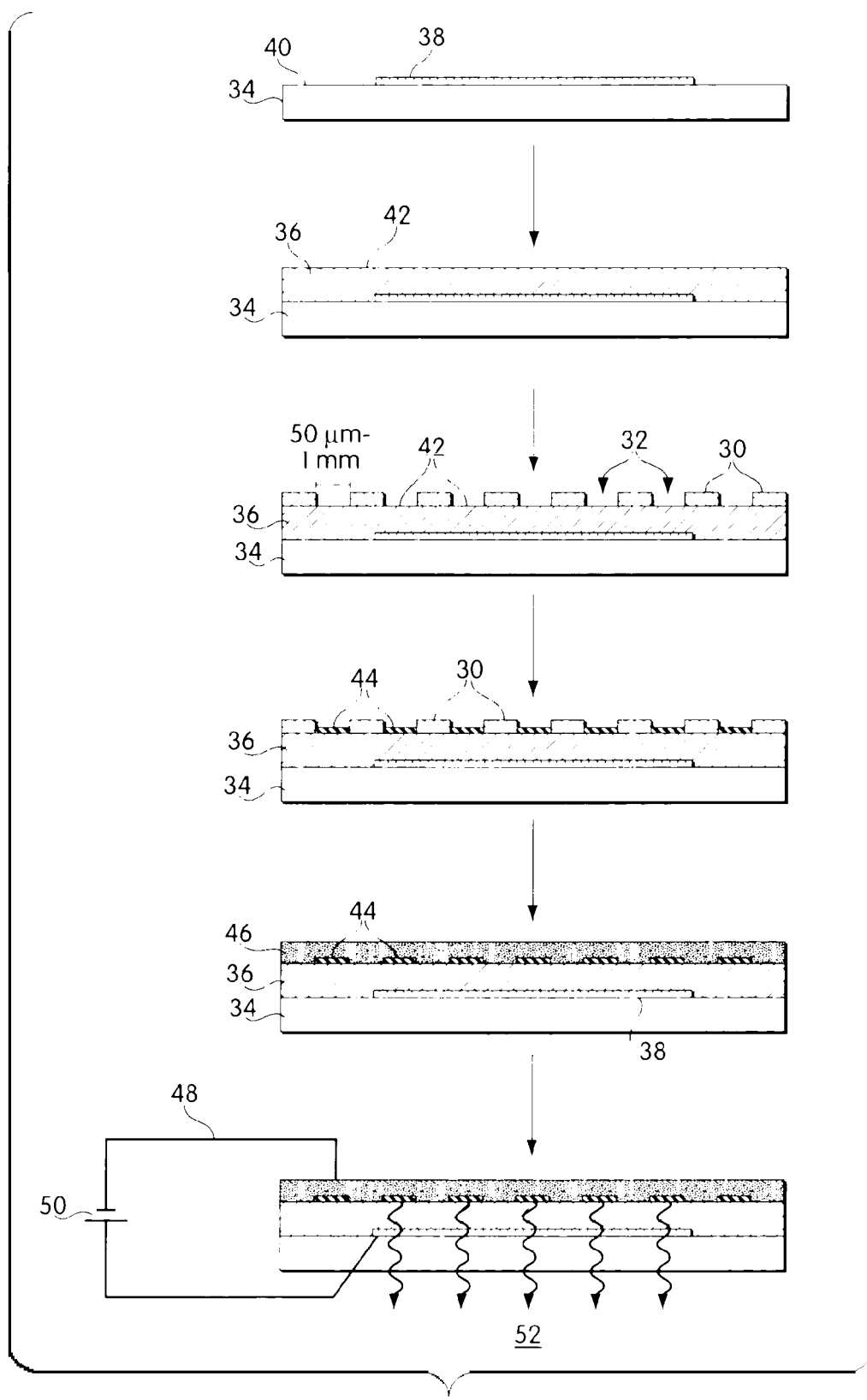
FIG. 4 schematically illustrates formation of an array of organic electroluminescent pixels on a surface using the masking system of FIG. 3.

One technique for use of mask 30 of the invention will now be described with reference to FIG. 4. FIG. 4 illustrates fabrication of a pixelated electroluminescent device. A substrate 34 (e.g., glass) is provided and a hole-transporting material (e.g., poly(N-vinyl carbazole) (PVK)) 36 is spin-coated onto an indium tin oxide (ITO) substrate 38 deposited on a top surface 40 of substrate 34. Mask 30 of the invention (shown in cross-section) is brought into conformal contact with top surface 42 of the hole-transporting material 36. Mask 30 can conform to surface 42 and form a close and reversible seal therewith. The tightly-sealed mask 30 allows selective deposition, through channels 32 thereof, of an emitter 44 (e.g., 8-hydroxyquinoline aluminum) via thermal evaporation to form a plurality of pixels of the emitter 44. Although not illustrated in FIG. 4 or in other figures, when a masking system is used to shield portions of a surface and deposition occurs at portions other than shielded portions, deposition may occur atop exposed surfaces of the masking system as well. Mask 30 then is re-placed by being removed from surface 42 of hole-transporting material 36, leaving the pixels 44 of emitter intact and adhered to surface 42. As used herein, "re-place" is meant to define moving the mask in any way between steps in a deposition process. Re-place can define removing the mask from the surface completely, or re-orienting the mask at the surface, that is, removing the mask and replacing the mask at the same surface in a different position. It is a feature of the invention that the mask is cohesive and can be removed from a surface as a single unit and re-used, i.e., the mask facilitates a "dry lift-off" procedure. The mask is cohesive in that attractive forces within the mask that hold the mask together are stronger than forces typically required to remove the mask from a surface. That is, the mask can be used to seal a surface during a deposition process, then can be removed by lifting a portion of the mask which draws the entire mask away from the surface, and the mask then can be reused. This is to be distinguished from a lithographically-created mask such as a photoresist mask. Use of a cohesive mask of the invention allows formation of the mask on the surface to be masked without degrading, at the surface, portions defining channels 32 (such as are degraded in creation of a lithographically-created mask). A cathode 46 (e.g., aluminum) then is evaporated on top of the device so as to cover and surround pixels 44 and coat portions of top surface 42 of hole-transporting material 36 not covered by pixels 44. Application of an electrical potential between cathode 46 and anode 38, via an electrical circuit 48 (including a power source 50 in electrical communication with cathode 46 and anode 38) creates electroluminescence 52 emanating from pixels 44.

Figure 5:
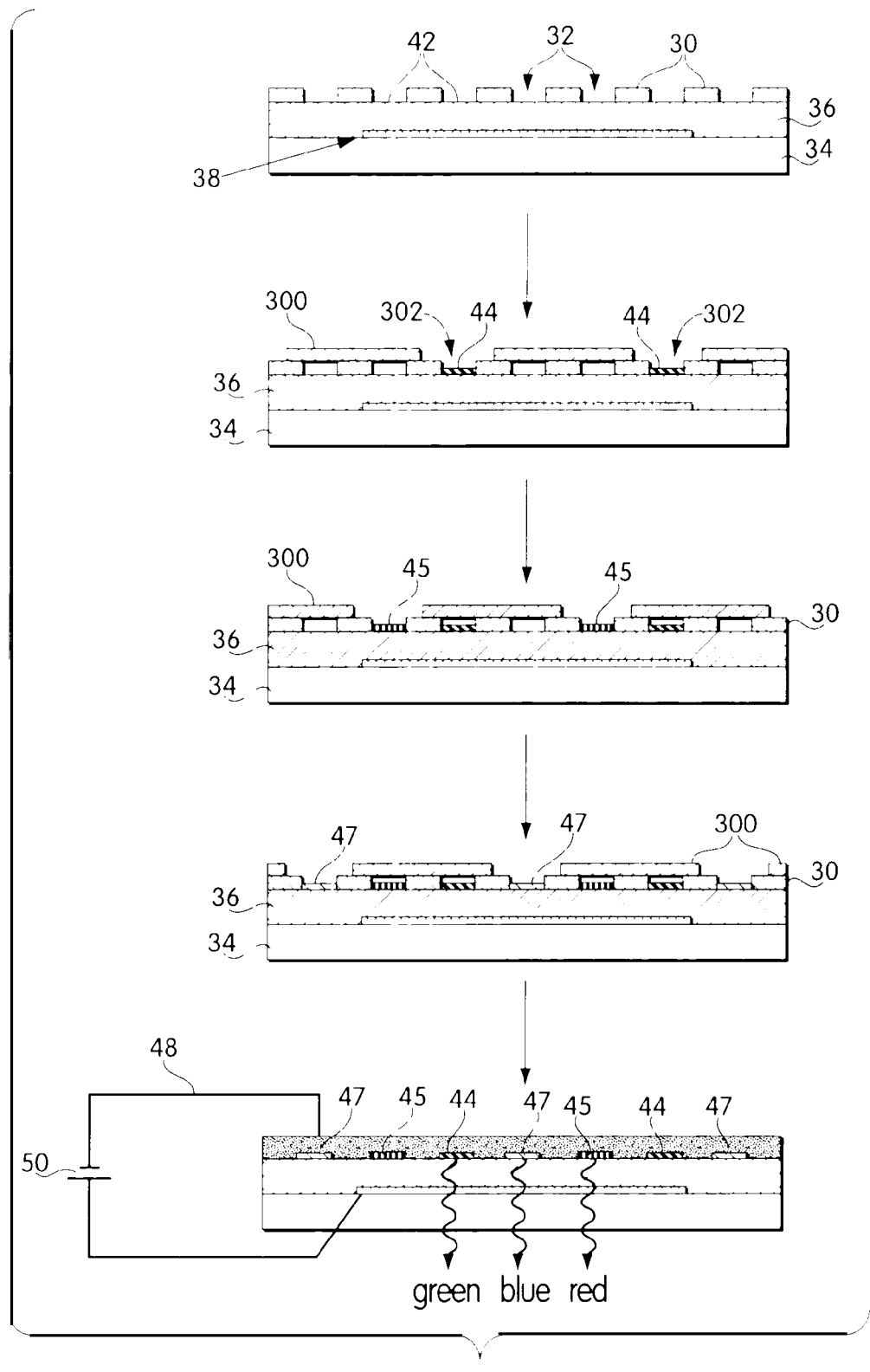
FIG. 5 schematically illustrates formation of a multi-color organic electroluminescent array using a masking system of multiple masks.

Referring now to FIG. 5, one technique for forming a multi-layer pixelated electroluminescent structure that can be used in accordance with the invention is illustrated schematically. The mask used in the technique illustrated represents but one pattern that can be used to pattern a surface. Other patterns, including different sizes, shapes, and spacing of channels can be used. The technique takes advantage of a method of the invention involving shielding a portion of a surface with a mask and applying an agent to an unshielded portion, then re-placing the mask and applying an agent to a shielded portion. A first mask 30 is brought into conformal contact with top surface 42 of hole-transporting material 36. Then, a second mask 300 is placed atop mask 30, the first and second masks defining a masking system. Mask 300 includes a plurality of channels 302 that are larger than channels 32 of mask 30. Mask 300 is placed atop mask 30 such that several of channels 32 of mask 30 are shielded by mask 300, while others of channels 32 remain unshielded. Specifically, mask 300 includes a series of linear channels 302 (elongates channels that extend into and out of the page) that allow exposure of a linear array of channels 32 of mask 30 to be exposed, while shielding other linear arrays of channels 32. As illustrated, mask 300 is aligned with every third line of channel 32 of mask 30. Together, the masking system defined by masks 30 and 300 shields a first portion of surface 42. An emitter 44 then is evaporated through channels 32 that remain unshielded to create a linear array of pixels at a second portion of surface 42. Mask 30 then is re-placed, i.e., re-oriented in relation to the surface, to shield a different set of channels 32. Specifically, mask 300 is removed, re-aligned, and re-sealed so as to shield channels 32 that it had left unshielded in the step previously described, while shielding an adjacent, linear array of channels 32. A second evaporation step of a second emitter 45 creates lines of pixels of a different color emitter on a portion of the first portion (which had been shield originally) of surface 42. This process can be repeated, exposing the remaining linear array of channels 32 to a third emitter 47. Finally, both masks 300 and 30 are re-placed (removed) leaving a linear array of pixels 44, a linear array of pixels 45 next to the array of pixels 44, and a linear array of pixels 47 in between the linear arrays 44 and 45. Where emitter pixels 45 emit red light, emitter pixels 44 emit green light, and emitter pixels 47 emit blue light, red, green, and blue light, respectively, will be emitted when an electrical potential is applied between cathode 46 (deposited atop pixels 44, 45, and 47) and anode 38 via electrical circuit 48.

Figure 6:
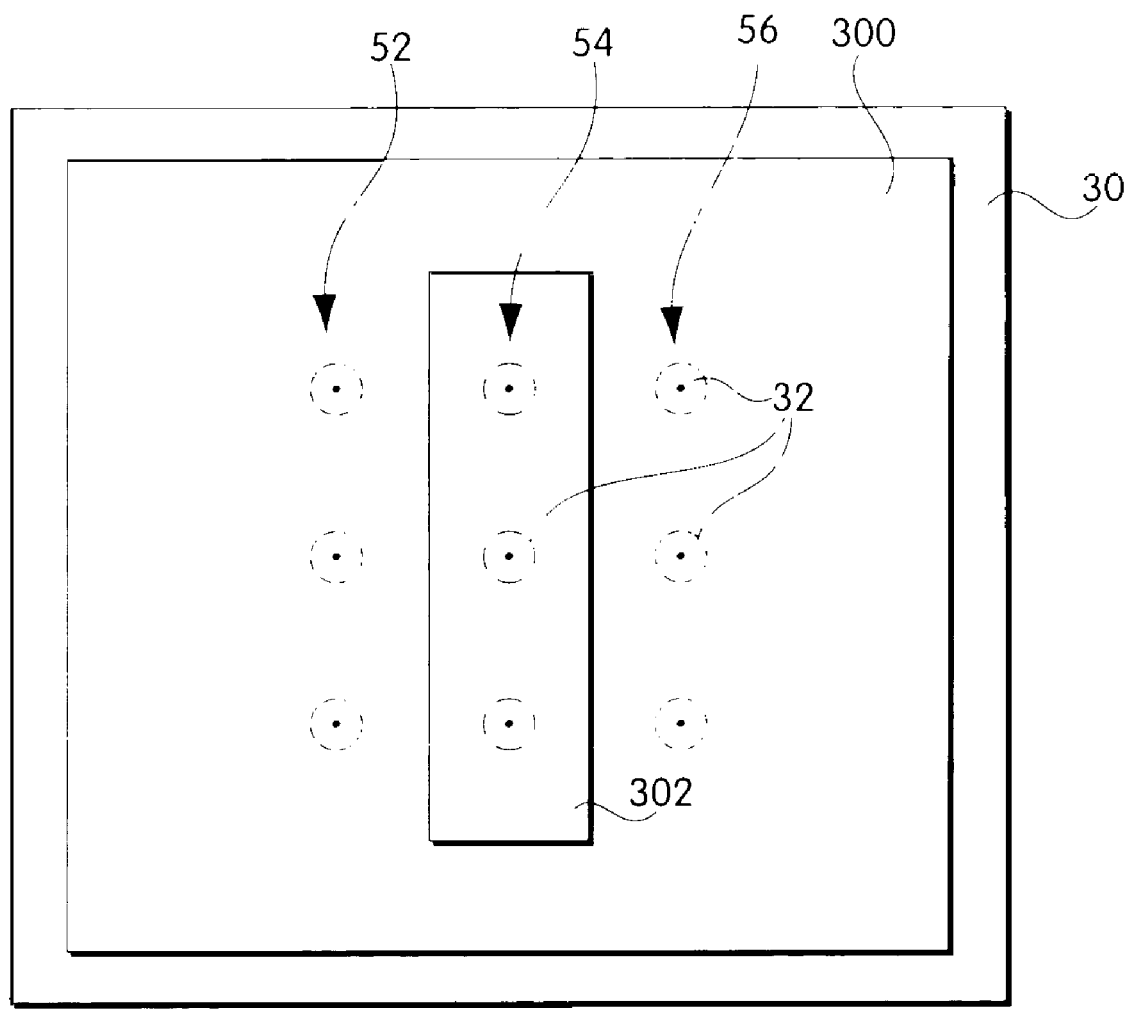
FIG. 6 is a top view of the masking system used in the procedure of FIG. 5.

FIG. 6 illustrates the technique of FIG. 5 from a top view. Mask 30 in FIG. 6 includes linear arrays 52, 54, and 56 of channels (holes) 32, corresponding to the different pixel arrays 44, 45, and 47 of FIG. 5. Mask 300 is a slit mask including an elongated opening (channel) 302, and mask 300 is positioned atop mask 30 such that channel 302 leaves linear array 56 of channels 32 of mask 30 unshielded, while shielding linear arrays 52 and 56 of channels 32. Mask 30 seals against top surface 42 of hole-transporting material 36 (not shown) and mask 300 seals against mask 30 after deposition of a first emitter material 44 in channels 32 of array 54. Mask 300 then is re-placed so as to expose array 54 of channel 32, while sealing against mask 30 so as to shield arrays 52 and 54. A second emitter material 45 then is deposited in channels of array 56, mask 300 then is re-placed so as to expose array 52 while shielding arrays 54 and 56, and a third emitter material 47 is deposited in channels 32 of array 52. Both masks then are re-placed (removed). The technique illustrated in FIGS. 5 and 6 can be carried out by hand under a stereoscope at resolution of about 200 microns, and at higher resolution using a rotation and alignment stage apparatus of the type readily available and usable by those of ordinary skill in the art.

Figure 7:
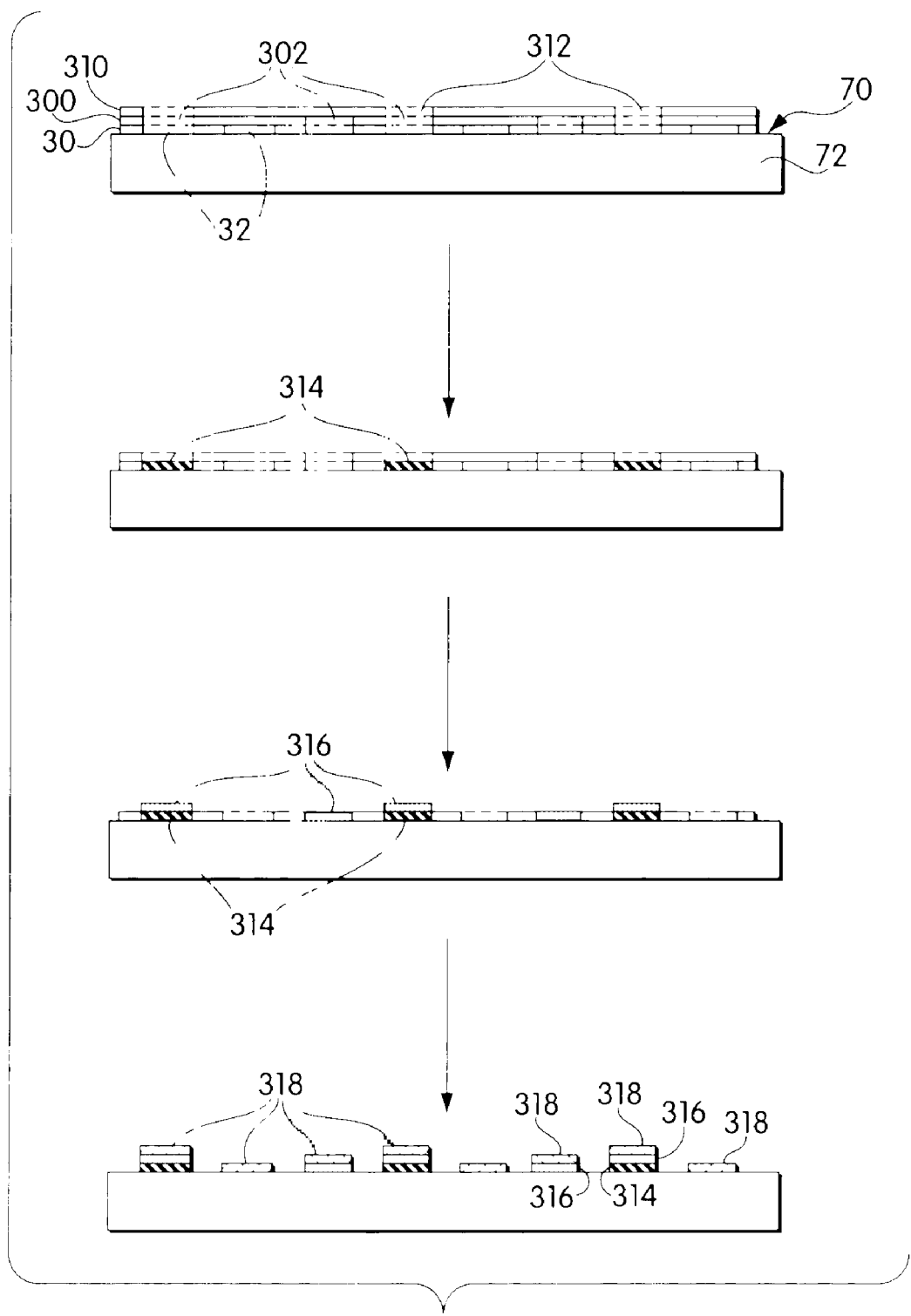
FIG. 7 schematically illustrates formation of an array of different materials on a surface using multiple masks.

FIG. 7 illustrates a technique similar to that illustrated in FIGS. 5 and 6, where a masking system including multiple masks is used and individual masks are re-placed not by being re-oriented relative to a substrate surface, but being removed between deposition steps. The arrangement in FIG. 7 involves selective deposition of a variety of materials on a surface 70 of a substrate 72. Masks 30, 300 and 310 are stacked, in that order, on a surface 70. Mask 30 includes a plurality of channels 32, mask 300 includes a plurality of channels 302, and mask 310 includes a plurality of channels 312. The masks are in register with each other such that in some cases channels of all three mask are in register with each other, in other cases channels of two masks only are in register with each other, and in other cases a channel of one mask is not in register with any channel of any other masks. As illustrated, this results in an arrangement in which every third channel 32 of mask 30 is in register with channels 302 and 312, every third channel 32 is in register with channel 302 only, and every third channel 32 is in register with no other channel. Following arrangement of the masks in this manner on surface 70 to shield a first portion of surface 70, the surface is exposed to conditions allowing deposition of a first agent 314 on a second portion of surface 70. Agent 314 is deposited only at those regions in which channels 32, 302, and 312 of masks 30, 300, and 310, respectively, are in alignment. Following removal of the top mask 310, a portion of the first portion of surface 70, that is, regions in which channels 32 and 302 had been in alignment, but not in alignment with any channel 312 of mask 310, now are exposed for further deposition. Exposure of the surface to appropriate conditions results in deposition of agent 316 atop agent 314 (under conditions where agent 316 can be deposited atop agent 314) as well as deposition at regions in which channels 302 and 32 had been in alignment but shielded by mask 310. Following removal of mask 300, additional regions of the first portion of surface 70 in register with channels 32 of mask 30, that had not been in register with channels of either of masks 300 and 310, experience deposition of agent 318 under exposure to appropriate conditions. Agent 318 also is deposited atop agents 314 and 316, where those agents are exposed, under conditions appropriate for such deposition. This technique can find use where it is desirable to expose, upwardly, different agents 314, 316, and 318. Where this is desired, the technique illustrated in either of FIG. 7 or in FIGS. 5 and 6 can be used. The technique of FIG. 7 is useful, in addition, where it is desired to have multi-layered structures for electronic or other purposes as would be apparent to those of ordinary skill in the art.

Mask 30 is used to shield portions of a surface not in register with channels 32 from an agent. In all of the embodiments described herein, shielding can be accomplished by positioning mask 30 proximate to a surface (such as surface 42 of material 36). "Proximate" in this context can define contact, or can define positioning of the mask between a source of the agent and the surface upon which the agent is to be patterned. Preferably, mask 30 is brought into contact with the surface desirably patterned and it is a feature of the invention that the surface of mask 30 that is brought into the surface of the article to be patterned is flexible so that it can be brought into conformal contact with the surface of the article to be patterned. "Conformal contact" in this context is meant to define essentially continuous contact between portions of mask 30, other than channels 32, and the surface of the article to be patterned. This is to be distinguished from, for example, a metal screen or a rigid polymer, each of which can contact a surface to be masked but which are not flexible enough to conformally contact the surface. In particularly preferred embodiments, a surface of mask 30 seals against a surface of an article to be patterned. "Seal" in this context means that when the mask is sealingly engaged with a surface and a fluid is applied to the masked surface, the fluid is allowed to contact only those portions of the masked surface in register with channels 32 of the mask and the fluid does not pass under the mask and contact shielded portions of the article surface covered by solid portions of the mask, so long as the fluid does not degrade the mask or the surface to be patterned (in which case fluid could pass under the mask due to degradation of the mask and/or surface). "Sealing" in this context is to be distinguished from the operation of other rigid or flexible masks that may be brought into conformal contact with a surface, but that can not seal against the surface.

Preferably, the surface of mask 30 that is brought into contact with a surface to be masked is flexible and polymeric, and preferably the entire mask 30 is flexible and polymeric. In particularly preferred embodiments, the surface of mask 30 used to mask a surface of an article is elastomeric, which allows the mask to readily seal the article to be masked, and in particularly preferred embodiments the entire mask 30 is elastomeric. As used herein, "elastomeric" defines an elastic polymer. Where mask 30 is flexible or elastomeric in its entirety, the masking of non-planar surfaces is facilitated. "Non-planar" includes curved surfaces.

The mask of the invention can readily conform to surfaces having relatively small radii of curvature. For example, masks of the invention can be used to pattern agents on surfaces having both negative and positive radii of curvature, such as both concave and convex surfaces. Masks of the invention have been used to pattern agents on the interior and exterior of cylindrical substrates.

Article 30 can be fabricated of an elastomer as described in co-pending, commonly-owned U.S. Pat. No. 5,512,131, issued Apr. 30, 1996 by Kumar, et al, entitled "*Formation of Microstamped Patterns on Surfaces and Derivative Articles*", and as described in International Patent Publication No. WO 96/29629 of Whitesides, et al., entitled "*Microcontact Printing on Surfaces and Derivative Articles*", published Jun. 26, 1996, both of which are incorporated herein by reference. One useful technique for fabricating article 30 involves spin coating an elastomer on a master (described above with reference to FIG. 1) rather than by simply pouring an elastomer precursor over a pattern as described by Kumar, et. al. This allows for even application of a layer of defined thickness thinner than the height of features on the surface of the master that create channels in the mask.

Elastomeric surface and masks of the invention should have a Shore A hardness of preferably from about 30 to about 70, so long as the elastomer can provide a seal where desired. Exemplary elastomers are disclosed in U.S. Pat. No. 5,691,018 (Kelley et al., filed Dec. 15, 1995), incorporated herein by reference.

Substrates that can be masked and patterned using mask 30 of the invention can be essentially any material including polymers, metals, ceramics, oxides, and the like. Silicon and silicon dioxide can be patterned using mask 30.

Any of a wide variety of agents can be applied to portions of an article of a surface remaining unshielded (in register with channels 32) by mask 30. Many of these are "dry" processes, and others involve "wet" chemical processing. The agent can be a precursor of a chemical vapor deposition product, that is, an article can be masked using mask 30 and exposed to chemical vapor deposition conditions whereupon a product, defining the agent, is deposited in unshielded portions in register with channels 32. Other "dry" processes include reactive ion etching or thermal or e-beam evaporation or sputtering of metals, metal oxides, and ceramics. Metal deposition, such as "wet" electrochemical deposition or electroless deposition, can be carried out from fluid precursors defining electrochemical or electroless plating baths. A prepolymeric fluid precursor can be used, such as a fluid containing species that can react to form a thermoset polymer at unshielded portions, or a fluid pre-polymer that can be polymerized at unshielded portions via photolysis, convective or radiative heat, free-radical polymerization, and the like. Additionally, a relatively low-melting polymer can be applied in a molten form, allowed to solidify at unshielded portions, followed by removal of the mask. These and other forms of polymerization are known to those of ordinary skill in the art and can be applied to the techniques of the present invention without undue experimentation. All types of polymerization, including cationic, anionic, copolymerization, chain copolymerization, cross-linking, and the like can be employed, and essentially any type of polymer or copolymer formable from a fluid precursor can be patterned in accordance with the invention. An exemplary, non-limiting list of polymers that are suitable include polyurethane, polyamides, polycarbonates, polyacetylenes and polydiacetylenes, polyphosphazenes, polysiloxanes, polyolefins, polyesters, polyethers, poly(ether ketones), poly(alkylene oxides), poly(ethylene terephthalate), poly(methyl methacrylate), polystyrene, and derivatives and block, random, radial, linear, or teleblock copolymers, cross-linkable materials such as proteinaceous material and/or blends of the above. Gels are suitable where dimensionally stable enough to maintain structural integrity upon removal of mask 30 from the substrate surface. Also suitable are polymers formed from monomeric alkyl acrylates, alkyl methacrylates, alpha-methylstyrene, vinyl chloride and other halogen-containing monomers, maleic anhydride, acrylic acid, acrylonitrile, specifically, methyl methacrylate, imides, carbonates, hexafluoroisopropyl methacrylate, acrylonitrile, bromophenyl acrylates or bromophenyl methacrylates, and the like. Monomers can be used alone, or mixtures of different monomers can be used to form homopolymers and copolymers. Non-linear and ferroelectric polymers can be advantageous. The particular polymer, copolymer, blend, or gel selected is not critical to the invention, and those of skill in the art can tailor a particular material for any of a wide variety of applications.

A variety of organic electroluminescent materials can be used, including those described in the following articles, each incorporated herein by reference: Renak, et al., "Microlithographic Process for Patterning Conjugated Emissive Polymers", *Adv. Mater.*, 1997, 9, 5, 392-394; Yam, "Plastics Get Wired", *Scientific American*, July 1995, 83-87; Kijima, et al., "RGB Luminescence from Passive-Matrix Organic LED's", *IEEE Transactions on Electron Devices*, 44, 8, August 1997; Shen, et al., "Three-Color, Tunable, Organic Light-Emitting Devices", *Science*, 6, Jun. 27, 1997; Burrows, et al., "Achieving Full-Color Organic Light-Emitting Devices for Lightweight Flat-Panel Displays", *IEEE Transactions on Electron Devices*, 44, 8, August 1992.

According to one embodiment, a polymerizable or cross-linkable species (optionally in a fluid carrier) including an admixed biochemically active agent such as a protein can be made to form a pattern on a substrate surface according to the described technique. For example, carboxylated DEXTRAN™ can carry admixed protein, be introduced into channels 32, and hardened. Where the DEXTRAN™ carries admixed biologically active agent, the article can be exposed to a medium suspected of containing a biological binding partner of the biochemical agent, and any biochemical binding or other interaction detected via, for example, diffraction, or via a change in coupling between waveguide cores as described more fully below. According to another embodiment, a species such as polymerizable or cross-linkable species can entirely coat a surface, mask 30 can be placed adjacent the surface, a biological agent can be introduced into channels 32 and allowed to admix with the polymerizable or cross-linkable species, and prior to or subsequent to removal of mask 30 species on the surface can be polymerized or cross-linked. In this manner, a surface having a pattern of biological agent compounded therein is produced, and can serve as a sensor for a biological binding partner of the biological agent via change in refraction or diffraction of light at the surface.

According to one embodiment of the invention, a patterned article is created using mask 30 that is dissolved or dispersed in a fluid carrier to form fluid precursor which is introduced into channels 32, whereupon the fluid carrier or solvent dissipates (e.g., is removed via evaporation from the mold channels and/or absorption into the substrate or mask 20). According to yet another embodiment, a patterned structure erected is an inorganic structure, such as a salt or ceramic. A salt soluble in a fluid precursor can be prepared as a solution defining a fluid precursor that is introduced into channels 32 and precipitated as a patterned salt structure by removal of solvent via evaporation, adsorption, or other physical or chemical change to the surrounding environment. Inorganic salts or ceramics can be carried as a suspension in a fluid carrier, flowed into channels 32, and precipitated or deposited. Metals, such as those commonly deposited from pastes in accordance with thick-film silk-screening techniques, can be applied to regions of a substrate surface defined by channels 32 where a paste is sufficiently fluid, or the paste and/or metal can be carried in a fluid as a suspension or sol in a fluid precursor. Those of ordinary skill in the art will recognize that a wide variety of non-electrically conductive, electrically semi-conductive, and electrically-conductive structures can be patterned proximate a substrate surface according to the inventive technique. Fluid precursors of inorganic materials, such as solutions from which materials can be precipitated, or suspensions from which a fluid carrier can be removed by dissipation or evaporation, can be used to form structures, such as waveguides, from materials such as $TiO_2$, $TiO_2$ $SiO_2$, ZnO, $Nb_2O_5$, $Si_3N_4$, $Ta_2O_5$, $HfO_2$, $ZrO_2$, or the like. U.S. Pat. Nos. 5,009,483, 5,369,722, and 5,009,483, each incorporated herein by reference, describe many suitable precursor and waveguide materials. Dye-doped fluid precursors can be used, and are advantageous in many situations.

Another fluid precursor can be a sol-gel precursor, and sol-gel techniques known to those of skill in the art can be used to create the solid structures in patterns, according to the invention. Ferroelectric and electrooptic materials and sol-gel processing of a variety of precursors to form a variety of species is well known to those of ordinary skilled in the art and can be applied and exploited by the method of the invention. For example, materials such as $PbScTaO_3$, (Pb, La)$TiO_3$ (PLT), $LiNbO_3$, $KNbO_3$, $LiTaO_3$, potassium diphosphate, potassium triphosphate, $PbMoO_4$, $TeO_2$, $Ta_2O_5$, $BaTiO_3$, BBO crystals, $Ba_{1-x}Sr_xTiO_3$, $Pb(Zr, Ti)O_3$, $SrTiO_3$, bismuth strontium tantalate, and the like. Other examples of sol-gel precursors that can define fluid precursors of the invention include precursors of multicomponent glasses or ceramics containing at least one oxide, such as silicate glasses or ceramics containing the oxides of aluminum, boron, phosphorus, titanium, zirconium, sodium, etc. Other sol-gel precursors appropriate for use are precursors of hybrid materials or organically modified ceramics, such as precursors of silicon oxycarbide or ORMOCERs. Other sol-gel precursors appropriate for use are described by Brinker and Scherer, in *Sol-Gel Science*; Academic Press, San Diego, 1990; Dislich, *Transformation of Organometallics into Common and Exotic Materials*; Dijhof, Dordrecht, 1998, volume 141; Pani, et al., *J. Am. Ceram. Assoc.*, 1994, 77, 1242; Ramamurthi, et al., *Mat. Res. Soc. Symp. Proc.*, 1992, 271, 351; Peiying, et al., *Sensors and Actuators*, 1995, A49, 187; Rao, *J. Electrochem. Soc.*, 1996, 143, 189; Li, et al., *Solar Energy Materials and Solar Cells*, 1995, 39, 179, each of which is incorporated herein by reference. Where a sol-gel precursor is used, a hydrolysis and polycondensation reaction takes place, preferably a two-step reaction. The working examples described herein use tetramethylorthosilicate as the main constituent in glasses formed according to this reaction. Other alkoxides react similarly. Sol-gel precursors that include mixtures of glasses or glasses that are mixtures of compounds. These structures can be deposited in any pattern that corresponds to a pattern defined by channels 32 and can include dimensions through a wide range as described herein. According to yet another embodiment, a biologically active agent can be dissolved or suspended in a fluid carrier as a fluid precursor and introduced into channels 32 adjacent portions of a surface masked with mask 30 and, prior or subsequent to removal of the mask, allowed to engage in a biochemical interaction proximate regions of substrate the surface in register with channels 32. For example, a biochemical agent can include a biotin linker while the substrate surface carries immobilized avidin, and biochemical interaction can be allowed to take place at regions of substrate the surface in register with channels 32 in this manner, linking the biochemical agent to the substrate surface at those regions. Biochemical agents can be immobilized proximate regions of the substrate surface according to other techniques as well. For example, where a substrate surface exposes a hydrophobic functionality, a biological agent such as a protein can be non-covalently immobilized at regions of the substrate surface in register with channels 32. To control orientation of a protein or other biochemical agent immobilized at a substrate surface via hydrophobic interaction, a hydrophobic chemical moiety can be coupled to the biochemical agent at a region of the agent remote from its active site. In this manner, the agent can be hydrophobically coupled to the surface and maintain exposure, away from the surface, of its biochemically active region. One of ordinary skill in the art can conduct a simple test to determine whether a biochemical agent is suitable for use with the described technique. The binding constant of a candidate biochemical agent for a target species can be determined using standard ELISA techniques. Then, the candidate biochemical agent can be hydrophobically immobilized (or immobilized in any other manner described herein or known to those of ordinary skill in the art, for example via a polyamino acid tag coupled to a metal ion immobilized at the surface by a chelating agent) at a variety of surfaces, and then assays can be performed to determine whether the agent has retained its ability to biologically bind to the target species or has been denatured and is unable to bind (this exemplary test is particularly useful in connection with biological agents that, in their native form only, bind target species, but when denatured do not bind the target species).

Biochemical recognition can be exploited in immobilization of a particular biochemical agent desirably patterned on a substrate surface. For example, a first agent can be immobilized (for example using hydrophobic coupling) at regions of the substrate surface (in register with channels 32), and a second agent (which is a biological binding partner of the first agent) then can be immobilized at regions other than those regions (for example via the technique illustrated in FIGS. 5-7). Biochemical recognition involving partners also can be exploited to trap biological agents at regions of the substrate surface using other biological agents that have been immobilized at those regions via mask 30. Biochemical recognition involving partners such as antibody antigen, antibody hapten, enzyme substrate, enzyme inhibitor, enzyme cofactor, biotin avidin, binding protein substrate, carrier protein substrate, lectin carbohydrate, receptor hormone, receptor effector, complementary strands of nucleic acid, repressor inducer, and the like can be exploited in connection with the technique. Those of ordinary skill will recognize a variety of uses for placement of such biochemically active agents at predetermined portions of a substrate surface in a pattern, for example as disclosed in co-pending, commonly-owned U.S. Pat. No. 5,512,131 of Kumar, et al. and International Patent Application Publication No. WO 96/29629, both referenced above.

According to yet another embodiment, a fluid precursor applied to a surface through channels 32 of mask 30 to form an agent at unshielded portions of the surface and register with channels 32 carries a suspended or dissolved chemically active agent that is an activating agent as described in a co-pending, commonly owned U.S. application Ser. No. 08/616,692 of Hidber, et al. entitled "Microcontact Printing of Catalytic Colloids", and corresponding international patent publication WO 97/34025, both incorporated herein by reference. When a fluid carrier is used in this and other embodiments, it can form part of a species or article immobilized proximate the substrate surface or can dissipate, for example via evaporation or adsorption into the mask or substrate surface, leaving the species carried in the fluid carrier immobilized at the surface. A non-limiting list of chemically active agents that can be patterned on a surface in accordance with the invention also includes agents as described by Lando (U.S. Pat. Nos. 3,873,359; 3,873,360; and 3,900,614) which can render a substrate surface amenable to metal plating, catalytic activating agents such as finely distributed metal particles and clusters such as conventional metal powders, substrate-fixed metal clusters or multimetallic clusters that are well known as valuable heterogeneous and homogeneous catalysts in organic chemistry, inorganic chemistry, and electrochemistry, etc. With reference to the application of Hidber, et al., such agents can include those capable of being applied to unshielded portions of a surface through channels of a mask of the invention in a form in which it can effect a chemical reaction (such as a metal deposition reaction), and immobilized at the surface with a degree of adhesion and for a period of time sufficient to participate in the desired chemical reaction. In one embodiment the chemically active agent can participate in a desired chemical reaction with the mask in position at the surface. In another embodiment, the chemically activation can be deposited at the surface in desired regions using the mask, followed by removal of the mask, followed by a second step involving the chemically active agent. For example, a catalyst can be deposited in desired regions using mask 30, mask 30 can be removed, and the catalytically active regions of the surface (locations where channels 32 had been) can promote metal deposition at those regions selectively. As such, one class of activating agents provided in accordance with one embodiment of the invention are distinguished from prior art agents applied with an applicator such as a stamp, for example as disclosed by Lando (U.S. Pat. Nos. 3,873,359, 3,873,360, and 3,900,614), in that the activating agent of the present invention is in a form suitable for effecting reaction such as metal plating or catalytic action when transferred to the surface. According to preferred embodiments, further chemical reaction at the surface to convert a precursor to a suitable agent, as necessitated in the referenced prior art methods, is not required. Metal deposition reactions contemplated include electrochemical deposition and electroless deposition, generally involving reduction of a metal cation to create the metal, facilitated in part by the lowering of the electrochemical potential involved in the deposition.

Activating agents that are finely distributed metal particles and clusters, such as conventional metal powders, including substrate-fixed metal clusters or multimetallic clusters are suitable for use as activating agents in accordance with the invention, and are well known as valuable heterogeneous and homogeneous catalysts in organic, inorganic, and electrochemistry. Exemplary activating agents include one or more metals of periodic table groups Ib, IIb, III, IV, V, VI, VIIb, VIII, lanthanides, and actinides, preferably copper and any metal more noble than copper, in particular Pd, Au, Ag, Pt, and Cu. Hydrogenation catalysts for example those effective in hydrogenating olefins or aromatics, as in the partial hydrogenation of benzene to form cyclohexene, with a substrate-fixed ruthenium activating agent or bimetallic activating agent (e.g. Ru/Sn) are contemplated. Zirconium and titanium catalysts, among others, are suitable for use in the invention that catalyze polymerization, such as polymerization of olefins such as ethylene, and these are intended to form part of the invention. Other examples of catalytic activating agents include those used in Heck reactions, e.g. in the Pd-catalyzed reaction of bromobenzene and styrene to form stilbene. Activating agents that are heterogeneous catalysts are also useful as electrocatalysts in fuel cells (in particular substrate-fixed Pt and Pt/Ru clusters). Activating agents prepared according to the invention can be homogeneous catalysts, such as those used in two phase systems (for instance $H_2O$/toluene), such as e.g. betaine-stabilized Pd clusters soluble in $H_2O$. Activating agents that are embedded in polymers can be used to prepare materials for electronic, optical and magnetic applications. Suitable embedding polymers include organic polymers, such as poly-p-phenylene-vinylene, polymethyl methacrylate, polysilanes, and polystyrene, or inorganic polymers, such as zeolites, silicates, and metal oxides. The well-known sol-gel process can be used to incorporate metal clusters in amorphous metal oxide materials (e.g. $SiO_2$) as activating agents.

Soluble metal clusters that are activating agents can also be surface-deposited to prepare novel materials for applications in optics and electronics, e.g. Pd on HOPG (highly oriented pyrolytic graphite).

Especially preferred as activating agents in accordance with this embodiment of the invention are colloidal activating agents. Suitable colloid-forming species and colloids are described in Hidber, et al., referenced above, and in European patent publication no. 672765 by Reetz et al., published Sep. 20, 1995, and incorporated herein by reference.

According to yet another embodiment of the invention a suspension of particulate species in a fluid carrier can be introduced into channels 32, followed by removal of the fluid carrier via dissipation, as discussed. The particulate species can be organic, inorganic, or polymeric material as described above, for example finely-ground polymeric, ceramic, or crystalline material, or can be in the form of microspheres. The application of microspheres in a predetermined pattern to a substrate surface can serve a variety of purposes that will be apparent to those of ordinary skill in the art upon reading the present disclosure, in light of the state of the art as set forth in several publications. An article by Lenzmann, et al., entitled "Thin-Film Micropatterning Using Polymer Microspheres", *Chem. Mater.*, 6, 156-159 (1994), incorporated herein by reference, describes formation of densely-packed monolayers of monodisperse polystyrene microspheres deposited on a glass substrate. The spheres serve as a mask for zinc sulfide deposition on the substrate as a thin film by thermal evaporation in vacuum. The mask (microspheres) are removed from the substrate surface after evaporative deposition leaving behind a surface with zinc sulfide features located in the interstitial spaces of the densely-packed spheres. For 2-micron diameter spheres, the lattice spacing of the resulting pattern is approximately 900 nanometers with individual trigonal pyramidal peaks. According to the present invention, a particular concentration of polymeric microspheres in a fluid carrier can be selected without undue experimentation that, when introduced into channels 32, followed by evaporation of the fluid carrier, would result in microspheres selectively patterned at regions of a substrate surface in register with channels 32.

Other materials that can be patterned on a substrate surface using masks of the invention include hydrogels, via dewetting; organometallic compounds, via evaporation; and the like.

The material defining the mask of the invention should be selected, in conjunction with an agent applied to unmasked portions of a surface, or a fluid carrier of the agent, such that the mask is not adversely affected during deposition. For example, in most embodiments it is desirable that the size of channels of the mask does not change during deposition. In this case, it is advantageous to select a deposition material or fluid carrier that does not swell the material of the mask.

A technique now will be described that can facilitate application of an agent to exposed regions of a surface of an article in register with channels of a mask of the invention. This technique makes the process feasible where, in some cases, the process would be very difficult or impossible, such as conditions in which the channels of the mask are very, very small and it is desirable to apply an agent to regions of the surface and register with the channel from a fluid that is difficult to interject into the channels. For example, where it is desirable to isolate and manipulate small quantities of liquid for studying single molecules, or very small numbers of molecules, the technique is useful. The technique can be used to position, at separate, isolated regions of a substrate surface in register with channels of a mask, less than about $1 \times 10^5$ molecules, on average (the average number of molecules per channel), or less than about $1 \times 10^4$ molecules or less than about 1000 molecules, or 100 molecules, or 10 molecules, or even on average 1 molecule per region. This can be accomplished readily because the volume of a "microwell", defined by a channel of a mask and the portion of a surface of an article and register with the channel, can readily be determined and the concentration of molecules within a fluid introduced into such channels can be known. It is known, for example, that a 1 femtoliter vessel filled with a 1 nanomolar solution will contain, on average, 1 molecule. The use of small amounts of materials in chemical reactions limits their hazard and environmental impact, and the present invention facilitates placement of small amounts of molecules at desired regions of a substrate surface.

The present invention allows formation of an agent, or product of an agent, selectively at a surface at regions in register with a channel or channels of a masking system with particularly good edge resolution. Preferred edge resolution values listed below can be achieved in combination with other aspects of the invention, for example feature size (channel size), channel spacing, and the like. In particular, edge resolution of better than 500 nanometers can be achieved, more preferably better than 300 nanometers more preferably better than 200 nanometers, and more preferably still better than 100 nanometers. "Edge resolution" in this context, means that the edge of an agent formed at a surface, using a masking system of the invention, followed by removal of the masking system where the agents remains at the surface in the shape of the channel, deviates from the edge of the channel used to create the agent by no more of about 500 nanometers or more preferred values. That is, where a channel of a perfect square shape is used to form an agent at a surface of an article, the edges of the square agent deviate from a perfect line by no more than about 500 nanometers or more preferred ranges. Where a perfectly circular channel in a masking system is used, a resulting circular agent is deposited at a surface of a substrate where the periphery of the circle of the agent differs from a perfect circle by no more than about 500 nanometers or more preferred ranges. Of course, not all channels will be perfectly square, circular, or of other specific geometric shape, but will be of a variety of shapes for a variety of purposes. Edge resolution of an agent created using such a channel defines deviation from the shape defined by the channel.

Figure 8:
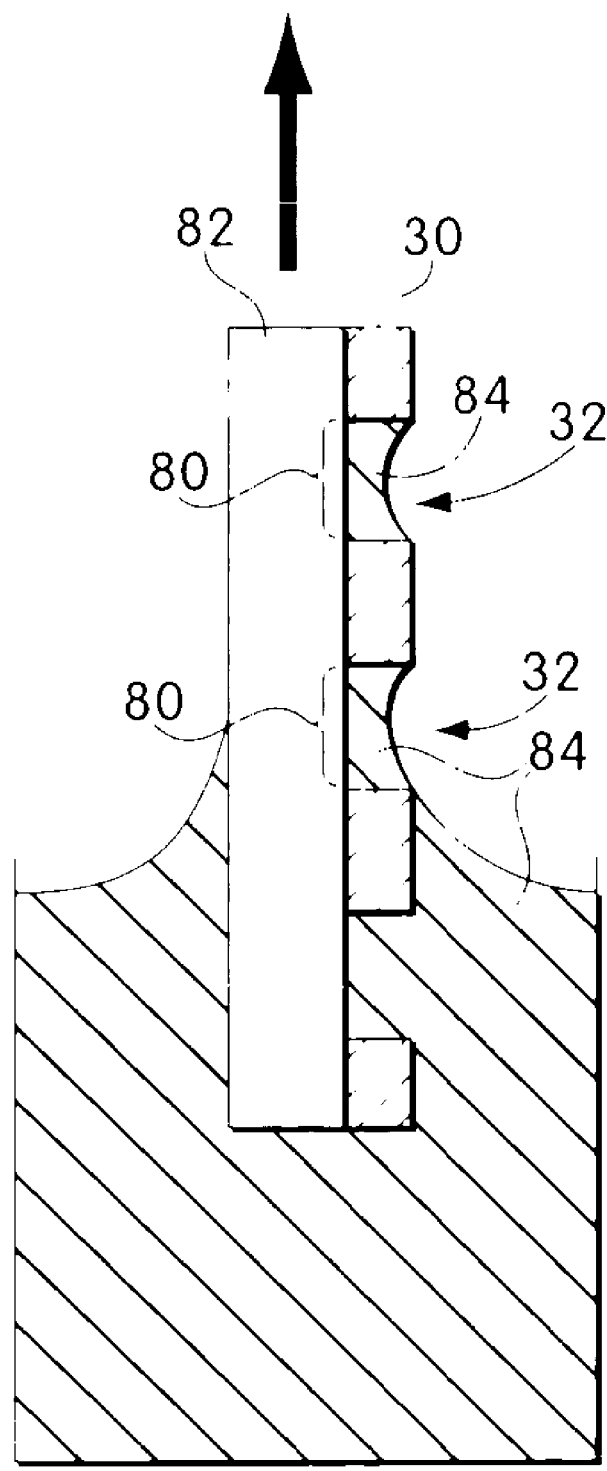
FIG. 8 illustrates schematically a technique for application of a fluid to regions of a substrate surface in register with channels of a masking system as illustrated in FIGS. 3-7.

One process for filling channels involves "discontinuous dewetting" which takes advantage of the difference in interfacial free energies of the channels and substrate surface, and the liquid that desirably fills microwells defined thereby (Jackman, et al., *Anal. Chem.* 1998, 70, 2280-7). In this technique, liquid is allowed to drain off of an array of microwells defined by mask channels and a substrate surface either by gravity or by pulling the array from a bulk solution. Where a suitable liquid/mask/substrate surface combination is selected, the microwells will remain filled with approximately equal volumes of fluid as the fluid dewets the surface of the material. FIG. 8 illustrates schematically discontinuous dewetting. In the technique, microwells 80, each defined by interior surfaces of channels 32 of mask 30 and portions of a surface of a substrate 82 in register with the channels, are filled with a fluid 84 as the substrate/mask assembly is pulled upwardly, in a vertical orientation, from a container containing fluid 84. The technique illustrated schematically in FIG. 8 is successful where three criteria are met. First, the fluid that is to fill the microwells should not swell the material defining the mask (many non-polar organic liquids, e.g. haptene, toluene, methylene chloride, acetone, and others swell PDMS). Second, the fluid should have a low viscosity (preferably less than about 500 cps) so that it begins to dewet the surface on a reasonable time scale. Third, the fluid must have a receding contact angle on the substrate (interior surfaces of channels 32 and regions 80 of the surface of substrate 82 and register therewith) that falls in an appropriate range. Specifically, where a PDMS stamp is used and a surface of substrate 82 has similar hydrophobicity or hydrophilicity, fluids that have receding contact angles that fall between about 16° and about 81° will fill the microwells easily by discontinuous dewetting. Liquids with contact angles above 81° tend to bead on the substrate (PDMS) and do not spread to fill the wells. Where a PDMS mask is used, table 1 presents a set of liquids that will fill microwells defined by the mask relatively readily, together with their interfacial free energies and contact angles on PDMS.

TABLE 1

| | YN (dyn/cm) | $\theta_a$ (° ± 5°) | $\theta_r$ (° ± 5°) |
|---|---|---|---|
| Water | 73.0 | 108 | 81 |
| glycerol | 63.4 | 104 | 70 |
| ethylene glycol | 48.0 | 92 | 54 |
| tri(ethylene glycol) | 45.6 | 76 | 59 |
| dimethylsulfoxide | 43.5 | 88 | 40 |
| dimethylformamide | 37.0 | 63 | 35 |
| butanol | 24.6 | 36[a] | 16[a] |
| ethanol | 22.4 | 31[a] | 20[a] |
| perfluorodecalin | 18.3 | 36[a] | 27[a] |

Where a volatile fluid is used to fill the microwells, problems associated with rapid evaporation of the fluids can be experienced unless steps are taken to counteract evaporation. Such steps can include the use of high ionic strength, buffered, aqueous solutions (where aqueous solutions are desired, for example, for biological experiments), and closed, humidity-controlled environments. Evaporation problems can be avoided completely by using less volatile solvents or co-solvents (e.g., triethyleneglycol).

Individual microwells also can be addressed with different fluids using a sharp glass probe (approximately 15 microns in diameter) that was used to hold a drop of fluid and to drag the drop of fluid across an array of microwells, filling a single line of microwells selectively. One probe can be made by dipping an optical fiber (125 microns diameter) into 48% HF for about 10 minutes. Individual wells can be selectively addressed in this manner by mounting a probe on an XYZ stage.

Figure 18:
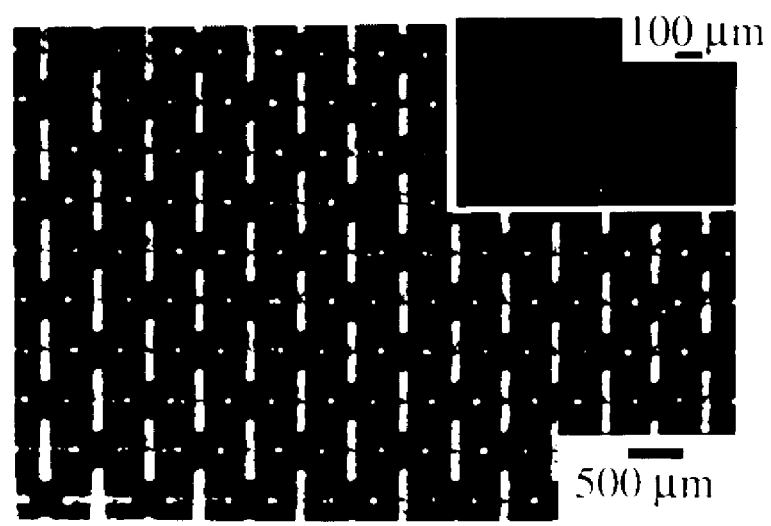
FIG. 18 is a photocopy of an optical micrograph of a gold grid formed using the mask of FIG. 17 in two deposition steps (see Example 8).

Described above are techniques in which a masking system is positioned adjacent a surface of an article, an agent is applied through a channel in the masking system to a surface of the article, and the masking system is re-placed followed by further application of an agent to a surface of the article. As described, this can involve moving, or re-orienting a mask on a surface so that channels in the mask align with different portions of the surface, and reapplication of an agent, or application of a new agent, through channels in the mask. This can be used to create continuous, or connected patterns on a surface using a mask with discontinuous, or non-connected channels, and this can have particular use in the microelectronics industry. In Example 8, below, a technique is described in which a single mask is used in two steps to direct a patterned array of isolated features in a first step, followed by re-orientation of the mask at the surface to produce the same pattern at the surface, but shifted laterally, the second pattern connecting the isolated regions defined by the first pattern to form an overall connected pattern. The resulting pattern, as illustrated in FIG. 18, is a grid pattern that would have been impossible to produce using a single mask deposition step because it would have required the mask to contain a series of disconnected squares.

The function and advantage of these and other embodiments of the present invention will be more fully understood from the examples below. The following examples are intended to illustrate the benefits of the present invention, but do not exemplify the full scope of the invention.

EXAMPLE 1

Fabrication of a Mask

A polydimethylsiloxane (PDMS) mask was fabricated.

A master (FIG. 1) including an array of photoresist posts on a silicon wafer was created by photolithography. The master consisted of an array of features in photoresist created on a silicon wafer. It was generated either by "rapid prototyping" (for feature sizes>50 μm)—by using a high-resolution transparency as the photomask for photolithography—or by performing standard photolithography with a chrome mask (for feature sizes<50 μm). The photomasks for performing photolithography were either rigid chrome masks (Advanced Reproductions, North Andover, Mass.; features<50 μm) or transparencies (produced using Herkules PRO image setter, 3387 dpi, Linotype-Hell Co., Hauppauge, N.Y., by a desktop publishing company, Pageworks, Cambridge St., Cambridge, Mass.; features>50 μm). In standard photolithography techniques, SU-8 50 (SU-8 5) resist (as received from Microlithography Chemical Corp., Newton, Mass.) was used. Spin-coating the resist at 5000 rpm for 40 s (2500 rpm for 40 s) produced a film approximately 50 μm thick. After baking the resist at 105° C. for 15 min. (5 min), it was exposed to UV light for 1 min (10 s) through a mask using a Karl Suss mask aligner. Features were developed in propylene glycol methyl ether acetate (PGMEA) fr ~5 min (1 min) after the wafer had been baked for 15 min (5 min) at 105° C.

Surface treatment of the silicon wafer by exposure to the vapor of perfluoro-1,1,2,2-tetrahydrooctyltrichlorosilane (United Chemical Technology, Bristol, Pa.) in a vacuum desiccator prevented adhesion of the elastomer to the wafer during the next step. Posts with diameters between 50 and 500 microns were 50 microns thick; for smaller (1.5 to 50 micron diameter) posts, the thickness of photoresist was approximately equal to the diameter of the posts.

Sylgard 184 silicone elastomer, parts A and B (10:1, by weight, Dow Corning) were mixed in a container and trapped air was removed under vacuum. PDMS was spin-coated onto the master so that the thickness of the layer of polymer was less than the height of the posts of photoresist. For 50 micron thick posts, the elastomer mixture was spin-coated at 3000 rpm for 40 s to yield a 30 micron layer of polymer; for thinner posts, the elastomer mixture was diluted in toluene and then spin-coated at 3000 rpm for 60 s. The PDMS was cured at 65 deg. C. for one hour. Especially in the case of thinner masks (less than 50 microns thick) a 1-mm thick layer of elastomer mixture was then painted around the pattern and cured. The polymer was peeled away from the master, using the thicker surround of PDMS as a support (in the case of the thinner masks), to yield a flexible, elastomeric membranous mask containing an array of holes with diameters varying from 1.5 to 500 microns.

Several factors determined the thicknesses of the elastomeric masks formed by this technique: speed and duration of spin-coating; lateral dimensions and spacing of features on the master; and the viscosity of the prepolymer (which changes as a function of time). For a given master (50 micron diameter circles, spaced by 50 microns) a given spin speed (3000 rpm) and PDMS mixed and degassed in vacuo for approximately 20 minutes before spin-coating, the mask thickness varied between 26 and 53 microns (at a minimum, i.e., between a set of four holes; and between 45 and 55 microns in the regions immediately adjacent to each feature) for different periods of spin-coating. When spin-coating for periods less than 50 seconds, the thickness of the mask was greater than the height of the features of photoresist on the master: the film of PDMS contained no holes. Spin-coating for more than 160 seconds resulted in defects in the masks that were significantly larger than the features. For times between 50 and 160 seconds, the masks were self-supporting and contained open holes. We typically used masks at the thicker end of this range to facilitate handling.

It is helpful in some circumstances, when using masks of the invention, to place a drop of fluid such as (in the case of a PDMS mask), 2-propanol or ethanol onto the mask after bringing it into contact with a substrate to reduce the tendency of the mask to stick to itself. Alternatively, to lessen self-adhesion, a second layer of a non-elastomeric polymer could be added to the elastomeric mask by spin-coating, for example, a layer of epoxy onto PDMS before its removal from the master. The composite mask did not tend to stick to itself, but still maintained its ability to seal against both planar and nonplanar surfaces.

To make two-layer masks (with PDMS and epoxy layers), supporting border of PDMS around the features was not formed; instead, after curing the PDMS, its surface was oxidized for 30 s using a plasma cleaner (Harrick, PDC-23G) and then a layer of epoxy (~10 µm thick; Eporek UVO114, Epoxy Technology, Billerica, Mass.) was spin-coated (800 rpm for 35 s) onto the wafer. Exposure to UV light for ~10 min cured the layer of epoxy. Rigid borders were produced around these masks by dispensing epoxy from a syringe to form a supporting frame around the features. Further exposure to UV light for ~10 min hardened the second layer of epoxy.

To release the masks, a cut was made around the border with a scalpel and then, using a pair of tweezers, the mask was peeled slowly from the master. The masks were brought into contact with the substrate to be patterned using a pair of tweezers. On contact with the substrate, the mask wet the surface and formed a reversible seal with it. If the mask was not lying flat on the substrate to begin, the mask was removed with tweezers, replaced on the surface, and allowed to reseal. In cases when using solvents was not problematic, a drop of 2-propanol was often placed on a mask in contact with a substrate. This procedure made it easier to ensure that the mask was lying flat on the substrate. In the cases where registration of the mask to an existing pattern was required, the sealing steps were performed under a stereoscope (Wild M26 stereoscope, Leica, Heidelberg, Germany) using a set of translation and rotation stages (Newport Corp., Irvine, Calif.).

EXAMPLE 2

Figure 9:
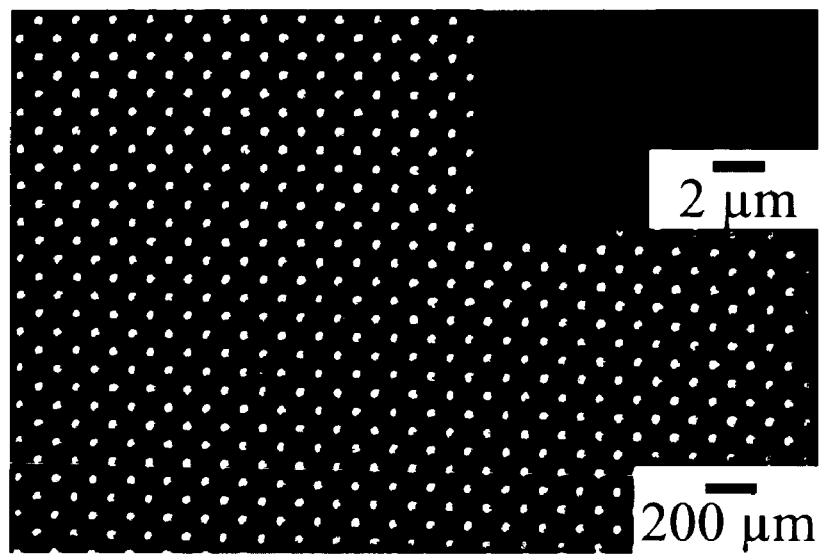
FIG. 9 is a photocopy of a scanning electron micrograph (SEM) image of gold dots created on a substrate surface using a masking technique of the invention.

A "Dry" Lift-Off Method: (A) Deposition of Agent Through Channels of Mask Followed by Removal of the Mask An agent was applied through the channels of the mask of Example 1 so as to form a patterned structure adhered to a substrate. A surface of the mask of Example 1 was sealed against a silicon substrate surface. The masked surface was exposed to conditions of gold e-beam deposition, resulting in deposition of gold on surfaces of the silicon substrate in register with channels of the mask. Specifically, deposition of a thin layer of titanium (5 nm. ~0.1 nm s) followed by a layer of gold (50 nm. ~0.3 nm s) by electron-beam evaporation (based pressure ~$5 \times 10^{-7}$ Torr) onto the masked substrate resulted in metal on both the substrate and the mask. Instead of processing with solvents to remove the "mask" of photoresist as in conventional lift-off, a "dry" lift-off technique of the invention was carried out by simply peeling the mask from the surface and allowing the gold to remain adhered to the silicon surface at regions in register with channels 32. FIG. 9 is an SEM image of resulting 50 micron circles of gold patterned on a silicon substrate according to this example. Excellent edge resolution of the gold features was observed.

EXAMPLE 3

Figure 10:
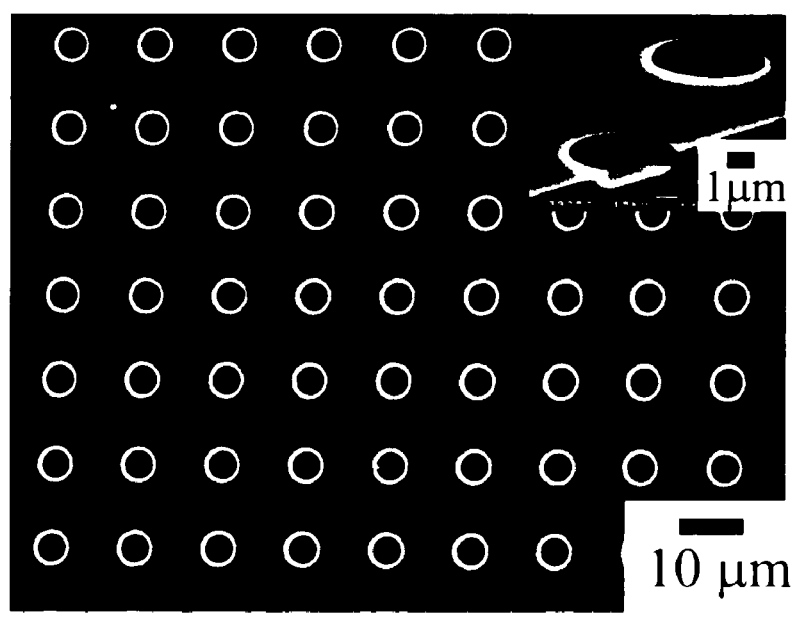
FIG. 10 is a photocopy of a SEM image of wells etched in silicon using a masking system of the invention.

A "Dry" Lift-Off Method: (B) Etching Through an Elastomeric Mask Followed by Removal of the Mask As in Example 2, an agent was delivered through a mask: in this example the agent was an etchant. A PDMS mask containing circular channels of 3 microns in diameter, separated by 7 microns, was brought into conformal, sealing contact with a silicon substrate. The masked surface was then exposed to Reactive Ion Etching (RIE), i.e., SF6 gas in a plasma discharge for 8 min. The mask was then removed from the surface to reveal "wells" etched into the silicon that were in register with the channels in the PDMS mask. Patterning by RIE usually requires photolithography to create a mask followed by a wet lift-off: these two steps are bypassed by using an elastomeric mask. FIG. 10 is an SEM image of the 3 micron diameter wells in silicon. Such structures could be used as nanovials for chemical analysis of very small volumes of samples.

EXAMPLE 4

Fabrication of Single-Color and Multicolor Electroluminescent Pixels

Figure 11:
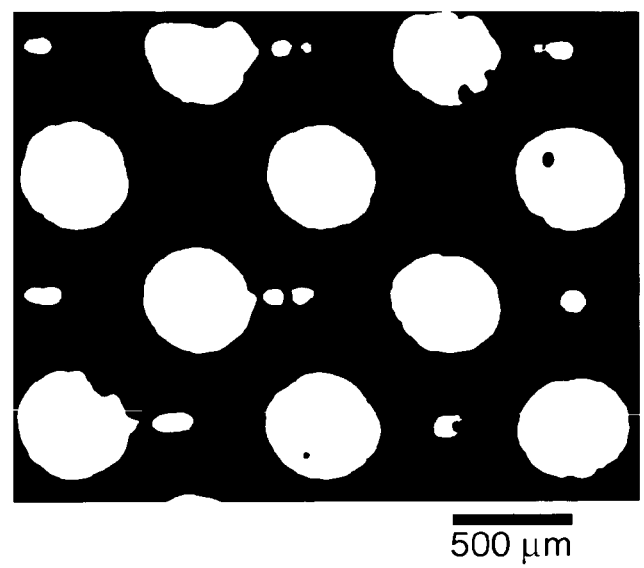
FIG. 11 is a photocopy of an image of electroluminescence from electroluminescent pixels created on a surface using a masking system of the invention.
Figure 12:
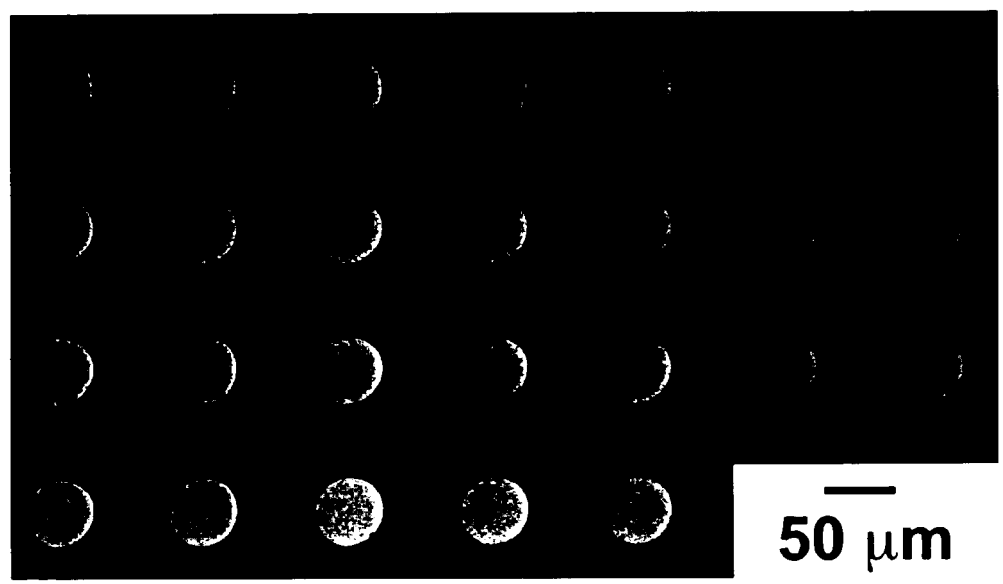
FIG. 12 is a photocopy of an optical micrograph image of photoluminescent material created on a substrate surface using the masking technique of the invention.
Figure 13:
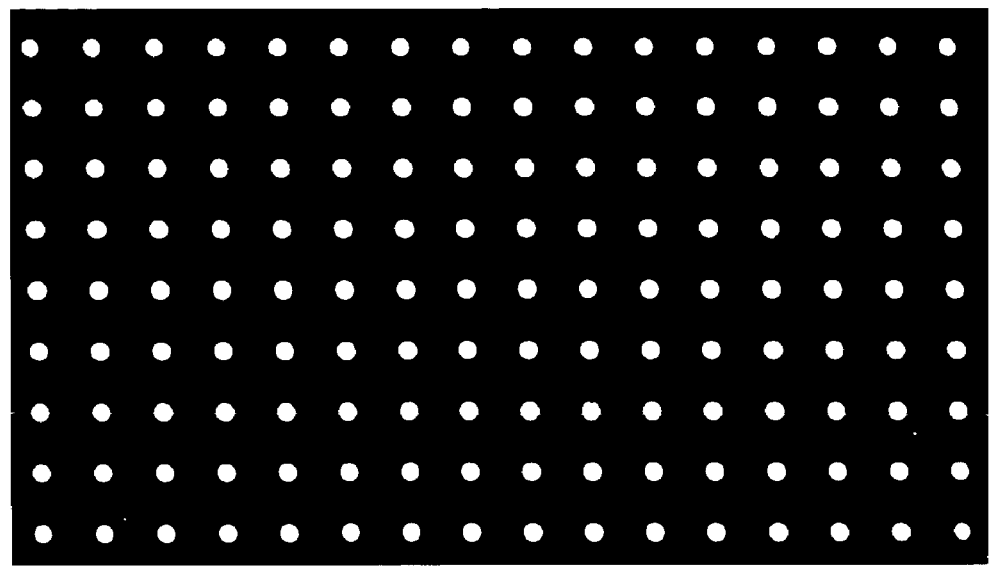
FIG. 13 is a photocopy of an image showing photoluminescence of a photoluminescent pixels created on a substrate surface using the masking technique of the invention.

A PDMS mask containing circular channels of 500 microns in diameter, separated by 500 microns, was brought into conformal, sealing contact with an indium tin oxide (ITO) layer patterned on a glass substrate. In alternate procedures, a PDMS mask containing either an array of circular holes (3 μm, spaced by 3 μm) or an alphanumeric pattern (smallest dimension ~100 μm) sealed conformally against a silicon substrate when brought into contact with it. An electroluminescent material, tris(8-hydroxyquinoline)-aluminum ($Alq_3$ 50 nm) was deposited by thermal evaporation (rate of deposition ~0.5 nm s: base pressure ~$5\times10^{-6}$ Torr) onto the mask and substrate. Peeling the elastomeric mask from the substrate left features of $Alq_3$ on the surface patterned as circles or alphanumeric characters. An aluminum cathode then was evaporated on top of the arrangement and an electrical potential was applied between the aluminum cathode and the ITO anode. FIG. 11 shows an image of the electroluminescence from 500 micron diameter pixels. FIGS. 12 and 13 show photoluminescence images of Alq3 pixels with diameters of 50 and 3 microns, respectively, patterned on a silicon substrate.

Multicolor pixels based on organic electroluminescent molecules can be created easily using two PDMS masks. A PDMS mask containing circular channels of 100 microns in diameter, separated by 100 microns, was brought into conformal, sealing contact with a substrate. A second mask containing rectangular channels 1 mm long and 150 microns wide, spaced by 300 microns, was sealed against the first mask so that the openings in the upper mask was aligned with every third line of channels in the lower mask. A mixture of 1,1,4,4-tetraphenyl-1,3-butadiene (TPB), which gives rise to blue electroluminescence, and Nile Red dye was thermally evaporated through the masks to pattern the first line of pixels. The upper mask was then re-placed by being removed and realigned with the line of pixels adjacent to those exposed previously: Nile Red dye was then evaporated through the masks to pattern a second line of pixels. The upper mask was then removed and realigned with the remaining line of unpatterned pixels: Alq3 was then evaporated through the masks. Lines of pixels of molecules that display red, green, and blue electroluminescence were revealed when both the upper and lower masks were removed. A photoluminescence image of red, green, and blue pixels with 100 micron diameters spaced by 100 microns created using two PDMS masks was observed. The use of two PDMS masks in this way saves several steps of photolithography and encapsulation that are usually needed to pattern multicolor displays.

EXAMPLE 5

Figure 14:
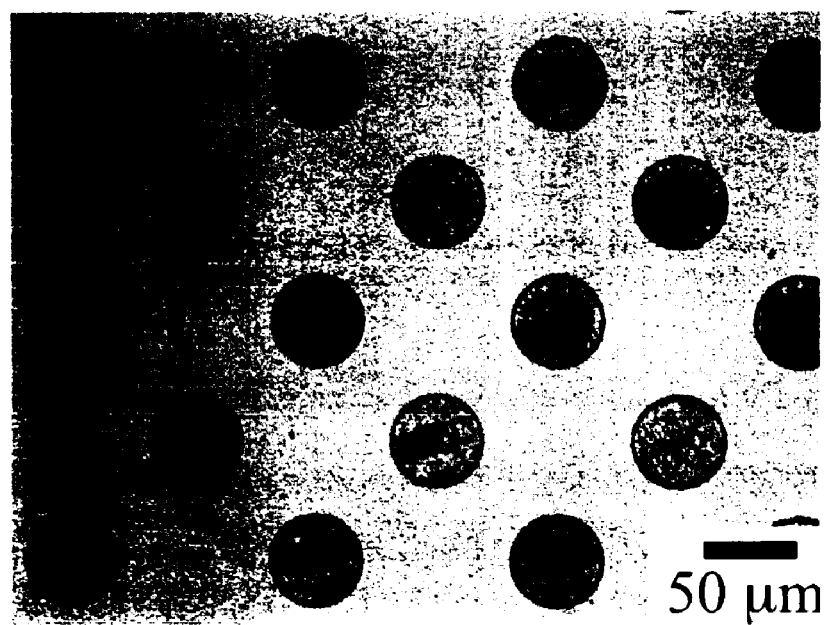
FIG. 14 is a photocopy of an optical image of silver circles electroplated onto gold using a masking technique of the invention.

Application of Agent From the Liquid Phase: Electroplating through an Elastomeric Mask Unlike conventional shadow masks, the conformal seal of the PDMS masks with the substrate to be patterned makes it possible to deposit materials from the liquid phase, for example, by electroplating. A PDMS mask containing circular channels of 50 microns in diameter, separated by 50 microns, was brought into conformal, sealing contact with a gold substrate, to create "wells" whose sides were defined by the channels in the mask and whose bottom was defined by the gold surface. The surface of the PDMS mask had been oxidized for 30 s using a plasma cleaner (Harrick, PDC-23C) to render the surface of the mask hydrophilic so that the plating solution would wet it. A drop of triethylene glycol was then put on top of the mask to fill the wells: air trapped in the wells was removed by vacuum. The substrate and mask was then placed in a silver electroplating solution: electroplating silver from a plating bath (Technic Silver E2, Technic, Providence, R.I.; current density ~20 $mA/cm^2$) onto the regions of the gold surface in register with the channels in the PDMS produced metallic microstructures on the conductive substrate. After removal of the mask, these structures remained on the surface. FIG. 14 is an optical image of the 50 micron diameter circles of silver electroplated onto gold.

EXAMPLE 6

Figure 15:
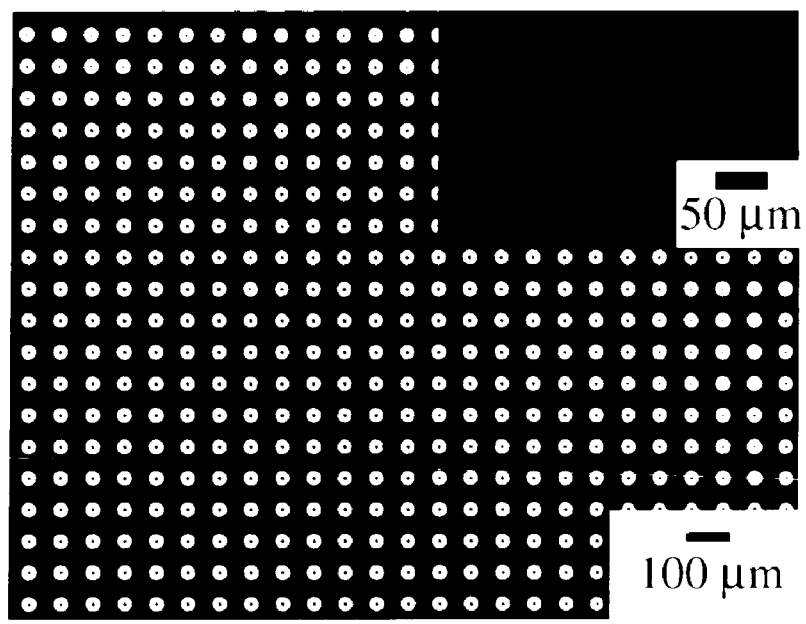
FIG. 15 is a photocopy of an optical image of glass circles created on silicon using a masking technique of the invention.

Application of Agent From the Liquid Phase followed by Solidification: Patterning Glassy Features using Sol-Gel Chemistry and Elastomeric Masks A PDMS mask containing circular channels of 50 microns in diameter, separated by 50 microns, was brought into conformal, sealing contact with a silicon substrate, 6.5 g tetramethylorthosilicate (TMOS) and 1.5 g 0.1 M oxalic acid were mixed for 1 min and left to stand for 1 h; a drop of this mixture was placed on top of the PDMS mask and a vacuum was applied to remove air from the wells (described in Example 5) filled with liquid. The silicon substrate and mask were tilted to drain the liquid from the surface, and then left in a sealed container along with a drop of ammonium hydroxide for 18 h. The acidified TMOS solution gels by hydrolysis and polycondensation under basic conditions to yield a glassy material: when the PDMS mask was removed from the silicon substrate, glassy structures in register with the channels in the mask were revealed. FIG. 15 is an optical image of the circles of solid glass on silicon created using this method.

EXAMPLE 7

Figure 16:
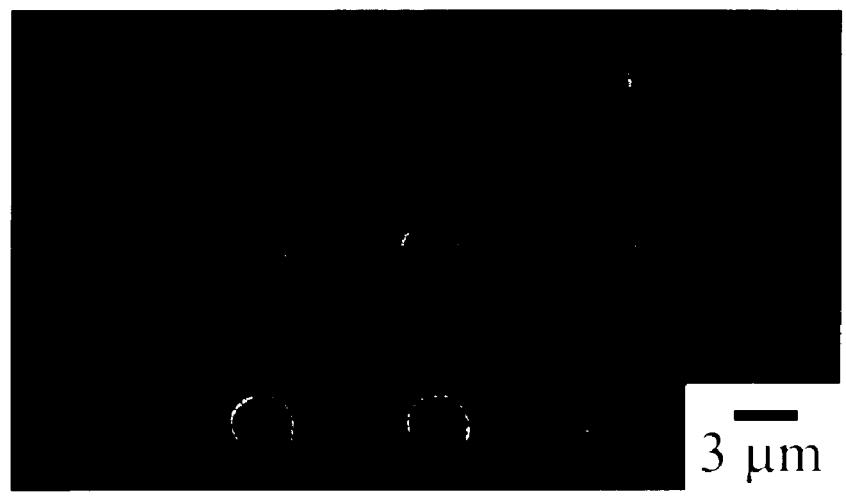
FIG. 16 is a photocopy of a fluorescence image of fluorescently-labeled protein immobilized at discreet regions of a surface using a masking technique of the invention.

Application of a Biological Agent From the Liquid Phase: Patterning Proteins Through an Elastomeric Mask A PDMS mask containing circular channels of 3 microns in diameter, separated by 7 microns, was brought into conformal, sealing contact with a gold surface coated with a monolayer of hexadecanethiol. A buffer solution (100 mM Tris, 20 mM boric acid) containing 2 mg/ml of a protein, bovine carbonic anhydrase, that had been fluorescently labeled with fluorescein isothiocyanate was prepared. A drop of the solution of protein was placed on the PDMS mask to fill the wells defined by the channels in the mask and the hydrophobic gold surface; trapped air was removed by vacuum. Only the areas of gold in register with the channels in the mask were exposed to the protein solution: the conformal seal ensured that liquid did not seep onto the other region of gold. After 2 h. the substrate and mask were washed with buffer solution and dried. The PDMS mask was then removed. Fluorescence images (FIG. 16) reveal that protein had adsorbed to the hydrophobic gold surfaces only in register with the channels in the mask.

EXAMPLE 8

Formation of Inter-Connected Pattern by Re-Placement of Masking System

Figure 17:
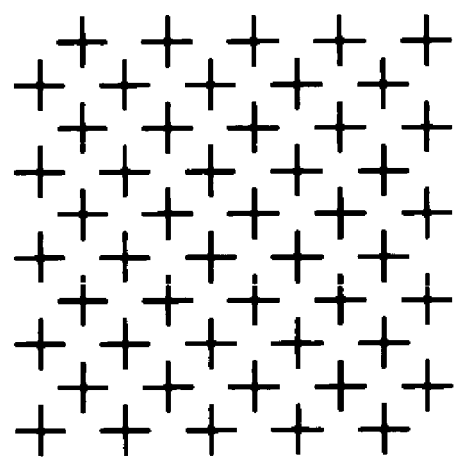
FIG. 17 is a photocopy of an elastomeric mask defining a staggered array of crosses, used in Example 8, below.

An adhesion promoter (Ti, 5 nm), followed by gold (50 nm) was evaporated through a mask containing an array of staggered crosses (FIG. 17). Performed dry lift-off once, and then translated the mask, deposited material again, and performed a second lift-off step to produce a square grid (FIG. 18).

EXAMPLE 9

Application of Hydrogel Pattern Through a Mask

We sealed a PDMS mask (50 µm circles, spaced by 50 µm) on a glass side that had been cleaned in piranha solution (concentrated $H_2SO_4$/30% $H_2O_2$ (3:1): Caution: piranha solution can react violently with organic materials and should be handled with care) and then oxidized for 60 s in a plasma cleaner: this step rendered the mask and substrate hydrophilic and easily wetted by the solution. A drop of a solution of gelatin (KNOX, Nabisco, Inc., East Hanover, N.J.) was then placed at 60° C. on the sample so that the mask was completely covered with solution. After the sample was degassed under vacuum (10-20 s) to remove air trapped in the wells formed by the mask in contact with the substrate, we placed the sample back in the oven at 60° C. and allowed the solution to dewet from the substrate, leaving solution in the wells. The sample was then left at room temperature to allow the solution to set and then removed the mask, leaving an array of patterned gelatin on the substrate (circles of approximately 50 microns in diameter). Polyacrylamide gels were also patterned using a similar technique. These patterned gels have potential applications, for example, as components in diffraction-based biological sensors or to create regular arrays of discrete, small features of photographic materials.

EXAMPLE 10

Application of Organometallic Compounds by Evaporation Through a Mask

Small organometallic molecules, such as tris(8-hydroxyquinoline) aluminum ($Alq_3$), can be evaporated through shadow masks, or patterned photoresist, but are usually soluble in the solvents used for lift-off since they may be useful in optical displays. Thermal evaporation of $Alq_3$ (500 Å), through an elastomeric mask, followed by dry lift-off, produced circular areas of the material. These patterns are photoluminescent and electroluminescent when addressed electrically. Patterns were approximately 5 micron diameter circles.

EXAMPLE 11

Application of Conducting Polymer Precursors by Chemical Vapor Deposition (CVD) Through a Mask We brought a mask (50 µm holes, spaced by 50 µm) into contact with a substrate (Si or indium tin oxide) and placed it into a CVD system (base pressure ~0.03 Torr). PPV was prepared from a dichloro-p-xylene starting monomer, in a method similar to CVD of parylene. The monomer (α,α'-dichloro-p-xylene) was heated to 60° C. and brought to a furnace where it was pyrolized at 675° C. to form a chloro-p-xylylene. This material was transported at low pressures (~0.1 Torr) to the deposition zone by an Ar carrier gas (flow rate ~8 sccm) where it condensed on the substrate 25° C.) and polymerized to form a PPV precursor (a chlorinated poly (1,4-xylylene)). After heating the substrate at 150° C. for ~1 h to partially convert the precursor, we performed dry lift-off. Further heating to 250° C. fully converted the precursor to PPV.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed is:

1. A method comprising:
   shielding a first portion, having a lateral surface dimension of less than 1 millimeter, of a surface of an article with a polymeric mask including at least one channel that defines a second portion of the surface of the article that remains unshielded by the mask, by positioning the mask in conformal contact with the surface without degrading a portion of the mask proximate the second portion of the surface;
   applying a biological agent to the second portion of the surface of the article; and
   engaging the biological agent in a biochemical interaction.

2. A method, comprising:
   shielding a first portion of a curved surface of an article with a polymeric mask by bringing a surface of the mask into conformal contact with the curved surface of the article;
   allowing biological agent to pass through a channel within the mask having a dimension of less than 1 millimeter and to be applied to a second portion of the surface of the article while preventing application of the agent to the first portion with the mask; and
   engaging the biological agent in a biochemical interaction.

3. A method comprising:
   shielding a first portion of a surface of an article with a polymeric masking system by bringing a surface of the masking system having a dimension of less than 1 millimeter into conformal contact with a surface of the article;
   allowing biological agent to be applied to a second, unshielded portion of the surface of the article while preventing application of the agent to the first portion of the surface of the article with the masking system;
   re-placing the masking system;
   applying a biological agent to at least a portion of the first portion of the surface of the article; and
   engaging the biological agent in a biochemical interaction.

4. A method as in claim 3, the shielding step comprising contacting the first portion of the surface of the article with a portion of a mask, and the re-placing step comprising removing the mask from the surface and applying the agent to the first portion without shielding the surface of the article with the mask.

5. A method as in claim 3, the re-placing step comprising re-orienting and re-sealing a mask of the masking system in relation to the surface of the article.

6. A method as in claim 3, wherein the masking system comprises a second mask, positioned between a source of the agent and a first mask, the first mask positioned between the second mask and the surface of the article.

7. A method as in claim 6, wherein the first mask seals against the surface of the article and the second mask seals against the first mask.

8. A method as in claim 7, wherein each of the first and second masks is a flexible polymeric article.

9. A method as in claim 8, wherein each of the first and second masks is elastomeric.

10. A method as in claim 9, comprising applying the agent to the second portion of the surface, re-placing the masking system by removing the second mask from the first mask thereby exposing at least a portion of the first portion of the surface while allowing the first mask to shield another portion of the first portion of the surface, and applying an agent to at least a portion of the first portion of the surface while shielding another portion of the first portion of the surface with the first mask.

11. A method as in claim 9, comprising applying a first agent to the second portion of the surface, re-placing the mask by removing the second mask from the first mask thereby exposing at least a portion of the first portion of the surface while allowing the first mask to shield another portion of the first portion of the surface, and applying a second, different agent to at least a portion of the first portion of the surface while shielding another portion of the first portion of the surface with the first mask.

12. A method as in claim 3, comprising applying a first agent to the second portion of the surface, re-placing the mask by removing the second mask from the first mask thereby exposing at least a portion of the first portion of the surface while allowing the first mask to shield another portion of the first portion of the surface, and applying a second, different agent to at least a portion of the first portion of the surface while shielding another portion of the first portion of the surface with the first mask.

13. A method comprising:
shielding a first portion of a surface of an article with an elastomeric masking system comprising at least a first mask and a second mask by bringing a surface of the first mask having a dimension of less than 1 millimeter into conformal contact with a surface of the article such that the first mask is positioned between the second mask and the surface of the article;
allowing a biological agent to be applied to a second, unshielded portion of the surface of the article while preventing application of the agent to the first portion of the surface of the article with the masking system;
re-placing at least a portion of the masking system; and
applying an agent to at least a portion of the first portion of the surface of the article; and
engaging the biological agent in a biochemical interaction.

14. A method as in claim 13, the re-placing step comprising removing the first mask from the surface and applying the agent to the first portion without shielding the surface of the article with the first mask.

15. A method as in claim 13, the re-placing step comprising re-orienting and re-sealing the first mask of the masking system in relation to the surface of the article.

16. A method as in claim 13, wherein the first mask seals against the surface of the article and the second mask seals against the first mask.

17. A method as in claim 16, wherein each of the first and second masks is flexible.

18. A method as in claim 17, wherein each of the first and second masks is elastomeric.

19. A method as in claim 18, comprising applying the agent to the second portion of the surface, re-placing the masking system by removing the second mask from the first mask thereby exposing at least a portion of the first portion of the surface while allowing the first mask to shield another portion of the first portion of the surface, and applying an agent to at least a portion of the first portion of the surface while shielding another portion of the first portion of the surface with the first mask.

20. A method as in claim 18, comprising applying a first agent to the second portion of the surface, re-placing the mask by removing the second mask from the first mask thereby exposing at least a portion of the first portion of the surface while allowing the first mask to shield another portion of the first portion of the surface, and applying a second, different agent to at least a portion of the first portion of the surface while shielding another portion of the first portion of the surface with the first mask.

21. A method as in claim 13, comprising applying a first agent to the second portion of the surface, re-placing the mask by removing the second mask from the first mask thereby exposing at least a portion of the first portion of the surface while allowing the first mask to shield another portion of the first portion of the surface, and applying a second, different agent to at least a portion of the first portion of the surface while shielding another portion of the first portion of the surface with the first mask.

\* \* \* \* \*

UNITED STATES PATENT AND TRADEMARK OFFICE
CERTIFICATE OF CORRECTION

| | | |
|---|---|---|
| PATENT NO. | : 7,282,240 B1 | Page 1 of 1 |
| APPLICATION NO. | : 09/694074 | |
| DATED | : October 16, 2007 | |
| INVENTOR(S) | : Rebecca J. Jackman et al. | |

It is certified that error appears in the above-identified patent and that said Letters Patent is hereby corrected as shown below:

On column 1, line 3, please add the following paragraph:

GOVERNMENT FUNDING
This invention was sponsored by National Science Foundation grant PHY93-12572 and the government has certain rights to the invention.

Signed and Sealed this

Eleventh Day of December, 2007

JON W. DUDAS
*Director of the United States Patent and Trademark Office*

UNITED STATES PATENT AND TRADEMARK OFFICE
CERTIFICATE OF CORRECTION

PATENT NO.        : 7,282,240 B1                                   Page 1 of 1
APPLICATION NO.   : 09/694074
DATED             : October 16, 2007
INVENTOR(S)       : Rebecca J. Jackman et al.

It is certified that error appears in the above-identified patent and that said Letters Patent is hereby corrected as shown below:

On the title page, item [63]:

At page 1, Related U.S. Application Data: please correct the priority information to read:

Continuation of application No. PCT/US99/08623, filed on Apr. 20, 1999, which claims priority to U.S. Pat. Apl. Ser. No. 09/063,742, filed Apr. 21, 1998.

Signed and Sealed this

Third Day of June, 2008

JON W. DUDAS
*Director of the United States Patent and Trademark Office*

UNITED STATES PATENT AND TRADEMARK OFFICE
CERTIFICATE OF CORRECTION

PATENT NO.         : 7,282,240 B1                                           Page 1 of 1
APPLICATION NO.    : 09/694074
DATED              : October 16, 2007
INVENTOR(S)        : Rebecca J. Jackman et al.

It is certified that error appears in the above-identified patent and that said Letters Patent is hereby corrected as shown below:

On the title page, item [63]:

At page 1, Related U.S. Application Data: please correct the priority information to read:

Continuation of application No. PCT/US99/08623, filed on Apr. 20, 1999, which is a continuation-in-part of U.S. Pat. Apl. Ser. No. 09/063,742, filed Apr. 21, 1998.

This certificate supersedes the Certificate of Correction issued June 3, 2008.

Signed and Sealed this

Eighteenth Day of May, 2010

David J. Kappos
*Director of the United States Patent and Trademark Office*